(12) United States Patent
Ohmi et al.

(10) Patent No.: US 8,502,450 B2
(45) Date of Patent: Aug. 6, 2013

(54) VACUUM TUBE AND VACUUM TUBE MANUFACTURING APPARATUS AND METHOD

(75) Inventors: Tadahiro Ohmi, Sendai (JP); Akihiro Morimoto, Sendai (JP)

(73) Assignee: Foundation for Advancement of International Science, Ibaraki (JP)

( * ) Notice: Subject to any disclaimer, the term of this patent is extended or adjusted under 35 U.S.C. 154(b) by 1159 days.

(21) Appl. No.: 10/594,896

(22) PCT Filed: Mar. 31, 2005

(86) PCT No.: PCT/JP2005/006258
§ 371 (c)(1),
(2), (4) Date: Sep. 29, 2006

(87) PCT Pub. No.: WO2005/096336
PCT Pub. Date: Oct. 13, 2005

(65) Prior Publication Data
US 2007/0210715 A1    Sep. 13, 2007

(30) Foreign Application Priority Data

Mar. 31, 2004    (JP) ................................. 2004-102364

(51) Int. Cl.
*H01J 61/12* (2006.01)
*H01J 61/22* (2006.01)
*H01J 17/20* (2006.01)

(52) U.S. Cl.
USPC ............................ 313/637; 313/638; 313/640

(58) Field of Classification Search
USPC ..................... 313/51, 576, 637–643
See application file for complete search history.

(56) References Cited

U.S. PATENT DOCUMENTS

| | | | | |
|---|---|---|---|---|
| 3,475,072 A | * | 10/1969 | Graves | 445/6 |
| 3,784,275 A | * | 1/1974 | Wiedijk | 445/6 |
| 5,844,356 A | | 12/1998 | Peters et al. | |

(Continued)

FOREIGN PATENT DOCUMENTS

| | | |
|---|---|---|
| JP | 53-080777 | 7/1978 |
| JP | 04-132154 | 5/1992 |

(Continued)

OTHER PUBLICATIONS

Office Action in corresponding Taiwan application No. 100210812001; issued Nov. 29, 2011; 7 pages.

(Continued)

*Primary Examiner* — Joseph L Williams
(74) *Attorney, Agent, or Firm* — Foley & Lardner LLP

(57) ABSTRACT

With respect to a vacuum tube having a reduced pressure vessel containing an electric discharge gas sealed therein, problems such as the lowering of discharge efficiency owing to an organic material, moisture or oxygen remaining in the reduced pressure vessel have taken place conventionally. It has been now found that the selection of the number of water molecules, the number of molecules of an organic gas and the number of oxygen molecules remaining in the reduced pressure vessel, in a relation with the number of molecules of a gas contributing the electric discharge allows the reduction of the adverse effect by the above-mentioned remaining gas. Specifically, the selection of the number of molecules of the above electric discharge gas being about ten times that of the above-mentioned remaining gas or more can reduce the adverse effect by the above-mentioned remaining gas.

3 Claims, 26 Drawing Sheets

U.S. PATENT DOCUMENTS

| | | |
|---|---|---|
| 6,325,901 B1 | 12/2001 | Hirayama et al. |
| 6,362,565 B1 * | 3/2002 | Katase et al. .................. 313/485 |
| 6,552,485 B2 | 4/2003 | Gehring et al. |
| 6,744,208 B2 | 6/2004 | Kado et al. |
| 6,885,144 B2 | 4/2005 | Matsuo |
| 2002/0024289 A1 | 2/2002 | Nikaido et al. |
| 2005/0093455 A1* | 5/2005 | Tamura et al. ................. 313/638 |
| 2005/0263719 A1* | 12/2005 | Ohdaira et al. ............. 250/492.1 |
| 2006/0097641 A1* | 5/2006 | Ohmi et al. .................... 313/631 |

FOREIGN PATENT DOCUMENTS

| | | |
|---|---|---|
| JP | 05-089783 | 4/1993 |
| JP | 05-283001 | 10/1993 |
| JP | 6-131976 | 5/1994 |
| JP | 9-199033 | 7/1997 |
| JP | 10-214593 | 8/1998 |
| JP | 11-500859 | 1/1999 |
| JP | 11-204034 | 7/1999 |
| JP | 11-213949 | 8/1999 |
| JP | 3081744 | 8/2001 |
| TW | 327233 | 2/1998 |
| TW | 398003 B | 7/2000 |
| TW | 442827 B | 6/2001 |
| TW | 507250 B | 10/2002 |
| TW | 508610 B | 11/2002 |
| TW | 525208 | 3/2003 |
| TW | 536739 B | 6/2003 |
| WO | WO02055756 A1 | 7/2002 |

OTHER PUBLICATIONS

English Translation of the TW Office Action dated Nov. 29, 2011; Taiwan patent application No. 100210812001; 3 pages.

* cited by examiner

VACUUM TUBE AND VACUUM TUBE MANUFACTURING APPARATUS AND METHOD

TECHNICAL FIELD

This invention relates to a vacuum tube, such as a fluorescent tube, a cold cathode tube, or an electron beam tube, that has been widely used.

BACKGROUND ART

Such a vacuum tube is put into an active state by filling a discharge gas for electric discharge into a reduced-pressure vessel and by causing the electric discharge to occur by applying the electric power from internal or external electrodes. As the kinds of electric discharges, there are various types such as arc discharge, glow discharge, and electron beam emission, but they are the same in that the operation is carried out by supplying the electric power to the reduced-pressure vessel. There are various methods for applying the electric power, various electrode layouts, and so on depending on uses. Generally, there are also various types such that electrons are emitted from a hot cathode, electrons are extracted by applying an electric field to an electron emitting electrode, and so on. Dc power or ac power is given as the electric power and selection is made according to the combination of electrodes with the electric power together with uses.

Patent Document 1

Japanese Unexamined Patent Application Publication (JP-A) No. 11-500859

DISCLOSURE OF THE INVENTION

Problem to be Solved by the Invention

A problem arises with respect to a vacuum tube such that the electrode lifetime is reduced or the discharge efficiency is lowered due to the influence of moisture or an organic gas remaining in a reduced-pressure vessel. The reduction in discharge efficiency causes a problem of a reduction in light emission luminance or the like in a fluorescent lamp or a cold cathode tube. With respect to a deuterium discharge tube, there arises a problem that filled hydrogen, moisture, oxygen, and an organic gas react together to reduce the amount of hydrogen and hence the light emission luminance is lowered or a problem that the lifetime of an electron emitting electrode is reduced. Further, with respect to an electron beam tube, such as an X-ray generating tube or the like, there arises a problem that the lifetime of an electron emitting electrode is reduced. With respect to an ultraviolet generator, a static electricity neutralizer, or the like using a deuterium discharge tube or an X-ray generating tube, there arises a problem such that the static electricity neutralizing performance is lowered due to a reduction in lifetime of a vacuum tube or a reduction in light emission luminance/dose, thus leading to a reduction in product quality due to the static electricity.

With respect to the foregoing problems, there is known a method of introducing an adsorbent (getter) or the like into a vacuum tube, thereby adsorbing the foregoing impurities. However, there arises a problem, such as, an increase in production cost, an increase in the number of processes with an activation process or the like, or a reduction in getter lifetime.

As the vacuum tube using the getter, there is a vacuum tube described in Patent Document 1 or the like.

Means for Solving the Problem

This invention has been made in view of the foregoing problems and provides a vacuum tube with a small amount of a remnants, such as an organic gas, moisture, and oxygen that cause a reduction in performance of the vacuum tube, and a method and apparatus for manufacturing such a vacuum tube.

A vacuum tube of this invention is a vacuum tube having a reduced-pressure vessel containing at least a discharge gas sealed therein for use in performing electric discharge and is characterized in that the sum total of the number of organic gas molecules, the number of water molecules, and the number of oxygen molecules remaining inside the reduced-pressure vessel is smaller than the number of molecules of the discharge gas. The ratio of the number of molecules of the discharge gas to the sum total of the number of organic gas molecules and the number of water molecules is preferably as large as possible and is preferably not smaller than ten times. It is more preferable that the number of water molecules adsorbed on the inner wall of the reduced-pressure vessel is not greater than $1 \times 10^{16}$ molecules/cm$^2$.

Further, in the vacuum tube of this invention, although the discharge gas is not particularly limited, it is preferable to use a gas that is used as a discharge gas and it is more preferable that a gas/gases selected from the group consisting of He, Ne, Ar, Kr, Xe, H$_2$, and D$_2$ be used alone or mixed together. The material of the reduced-pressure vessel is not particularly limited as long as it is a transparent material, but it is preferable to use silicon oxide as a main component in terms of its emitting moisture amount and workability.

Effect of the Invention

A vacuum tube manufacturing apparatus of this invention can obtain a vacuum tube with no reduction of lifetime because it is possible to suppress the amount of impurities such as moisture and organic matter remaining in the manufactured vacuum tube.

BRIEF DESCRIPTION OF THE DRAWINGS

FIG. 23 is a diagram showing the state where He and Ne are sealed in.

BEST MODE FOR CARRYING OUT THE INVENTION

Figure 1:
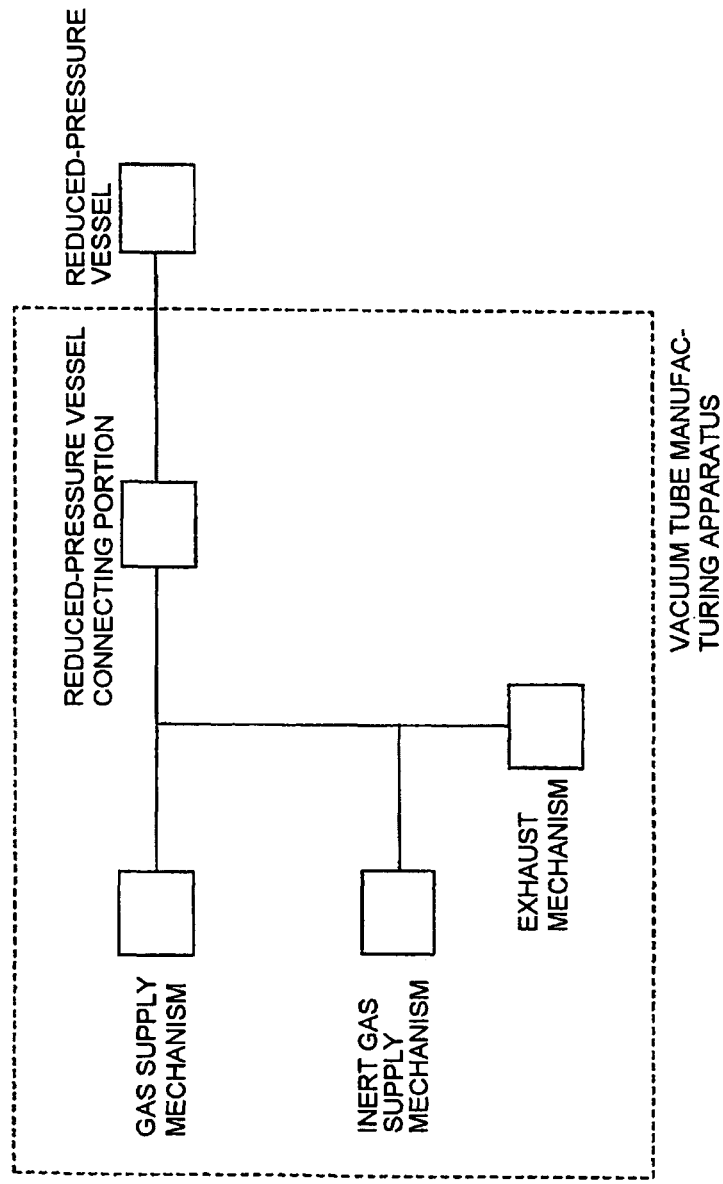
FIG. 1 is a block diagram showing a schematic structure of a vacuum tube manufacturing apparatus according to this invention.

As shown in FIG. 1, a vacuum tube manufacturing apparatus according to this invention comprises a reduced-pressure vessel connecting portion, a gas exhaust mechanism connected to the reduced-pressure vessel connecting portion, and a gas supply mechanism connected to the reduced-pressure vessel connecting portion and is characterized in that an inert gas supply mechanism is disposed on the reduced-pressure vessel side of the gas exhaust mechanism and further characterized in that the gas exhaust mechanism is an exhaust pump and the inert gas supply mechanism is disposed on the exhaust side of the exhaust pump. With this configuration, it is possible to suppress back diffusion of impurity components (moisture/organic matter) from the exhaust side of the pump.

Figure 2:
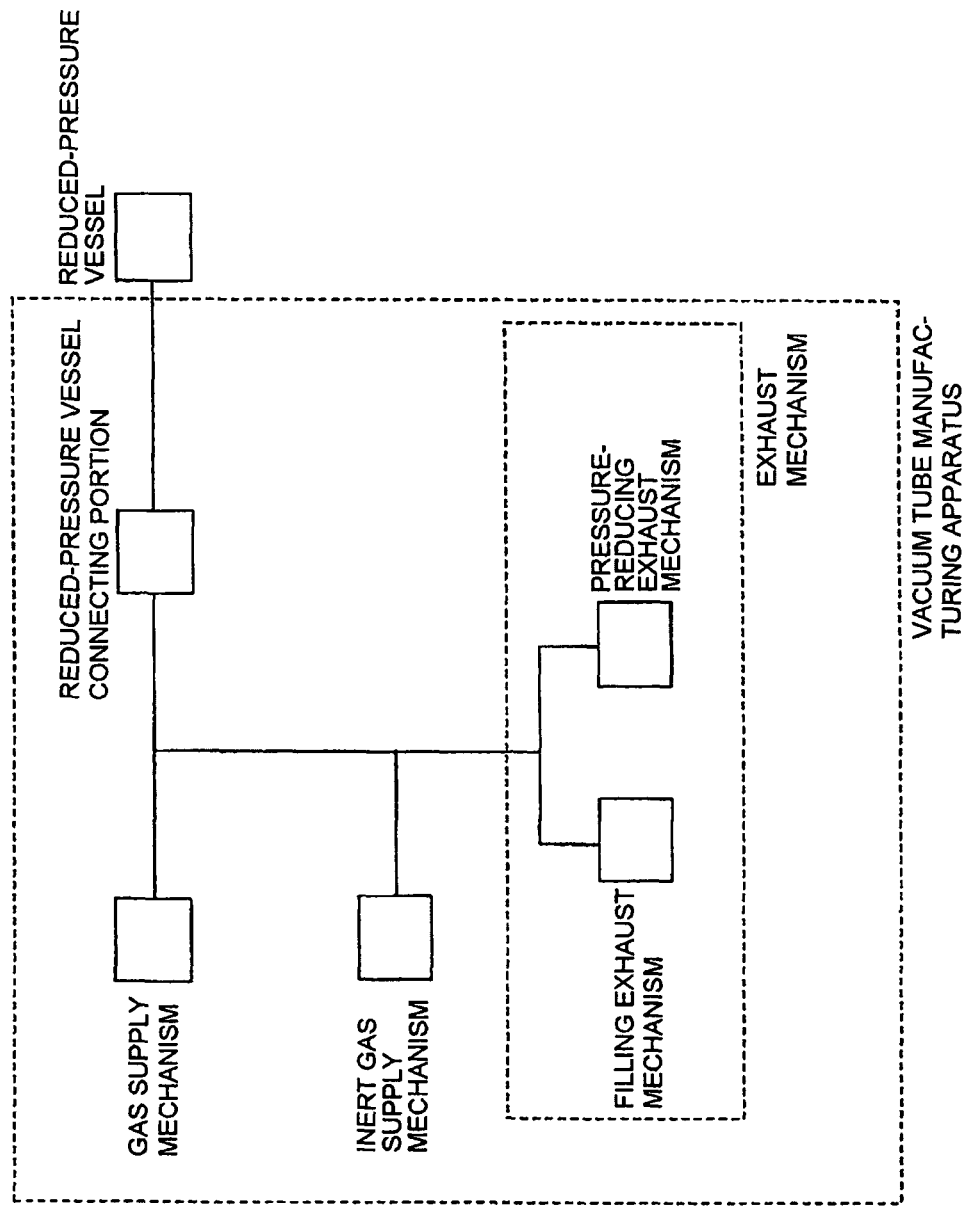
FIG. 2 is a block diagram showing a pressure-reducing exhaust mechanism and a filling exhaust mechanism that form a gas exhaust mechanism shown in FIG. 1.
Figure 3:
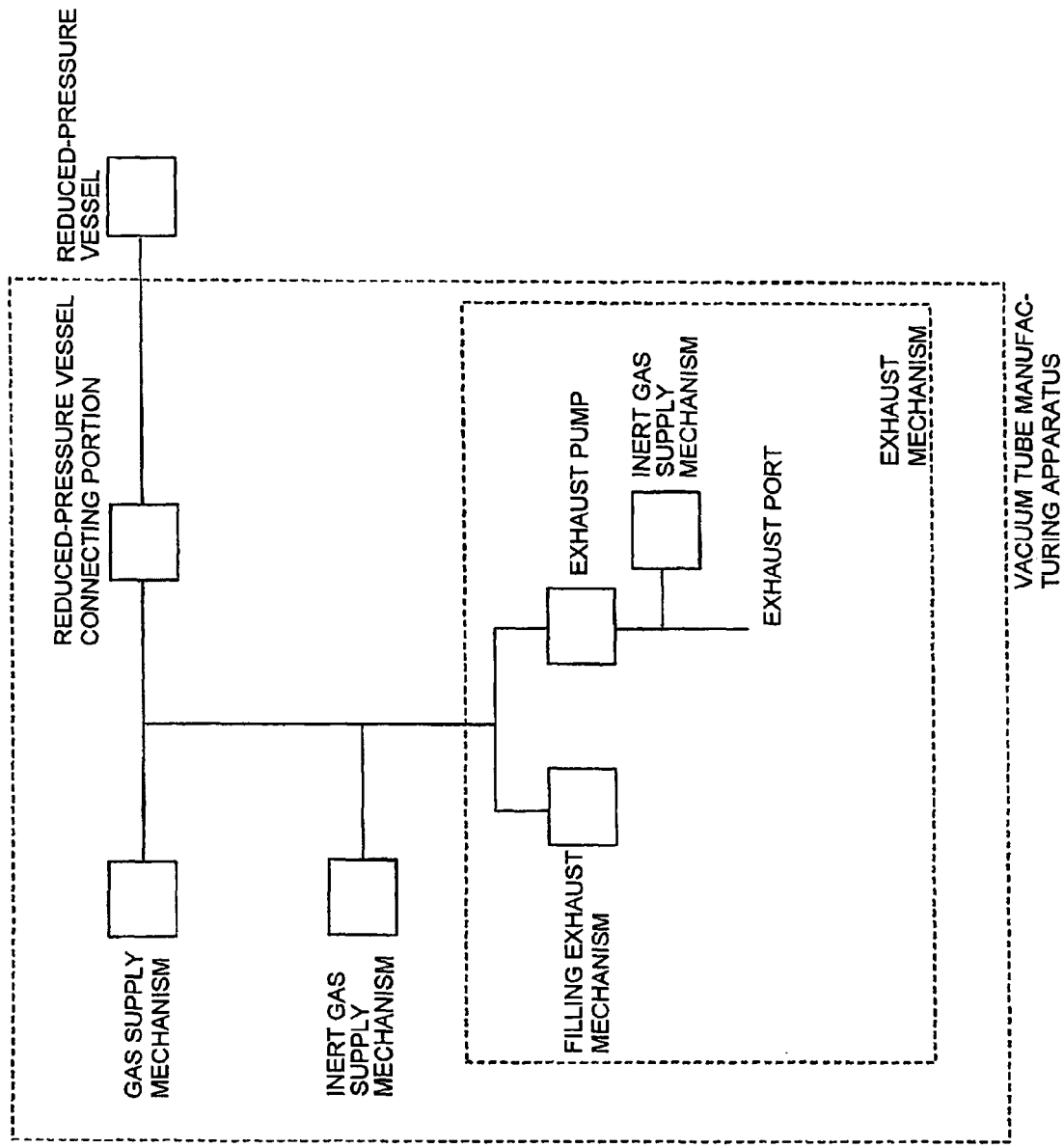
FIG. 3 is a block diagram showing the structure of the pressure-reducing exhaust mechanism more specifically.
Figure 4:
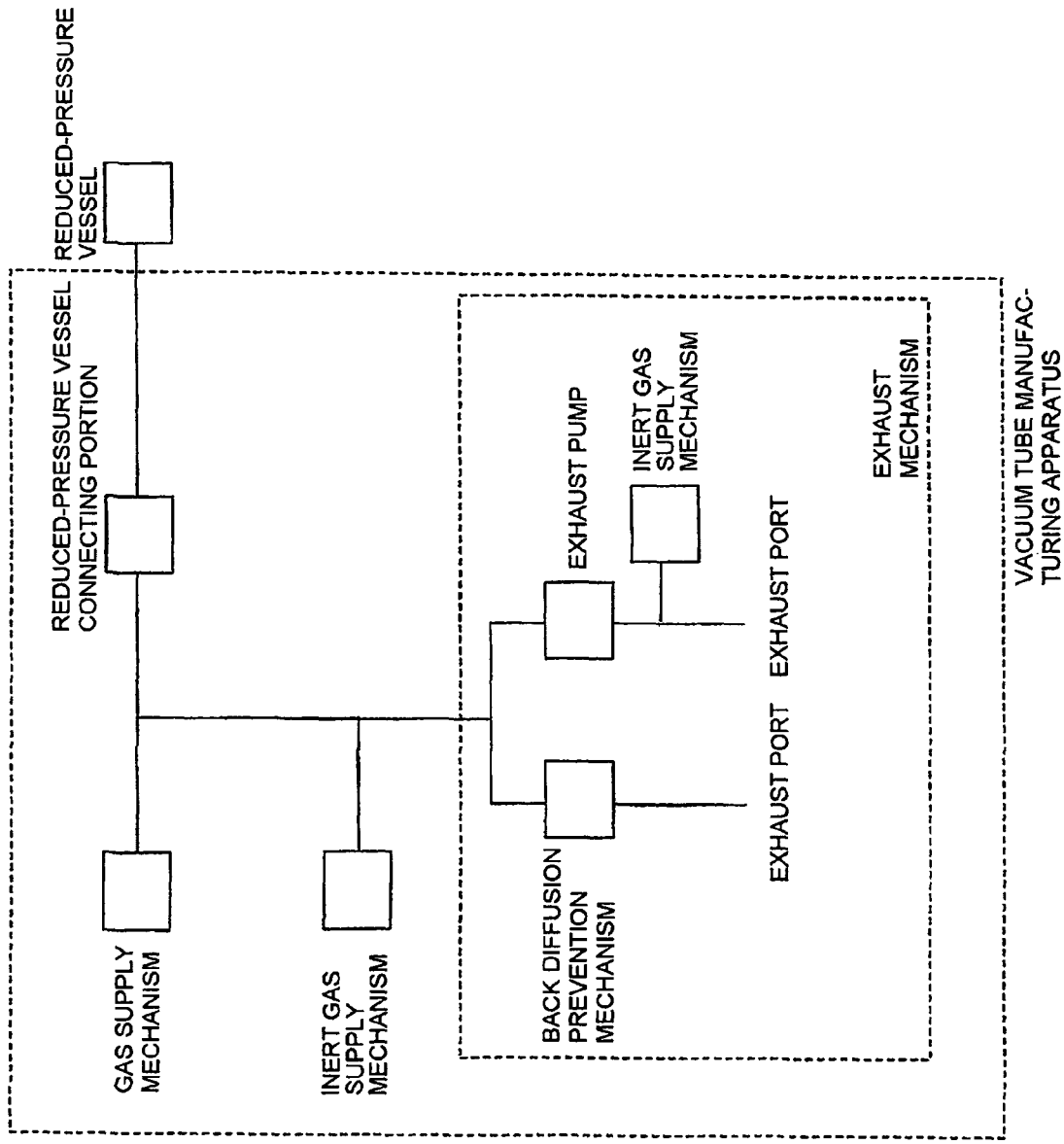
FIG. 4 is a block diagram showing the structure of the filling exhaust mechanism having an illustrated back diffusion prevention mechanism.

Further, in the vacuum tube manufacturing apparatus of this invention, as shown in FIG. 2, the gas exhaust mechanism is characterized by comprising a pressure-reducing exhaust mechanism and a filling exhaust mechanism. By separating the exhaust mechanism for evacuating the inside of the tube from the exhaust mechanism for use in filling or supplying a discharge gas, it is possible to prevent impurities from being mixed with a quite few amount of the filling gas. As shown in FIG. 3, the pressure-reducing exhaust mechanism comprises an exhaust pump and an inert gas supply mechanism disposed on the exhaust side of the exhaust pump. With this configuration, it is also possible to suppress back diffusion of impurity components from the exhaust side of the pump. Further, as shown in FIG. 4, the filling exhaust mechanism preferably comprises a back diffusion prevention mechanism. With this configuration, it is possible to suppress a mix of impurities from the exhaust side.

Figure 5:
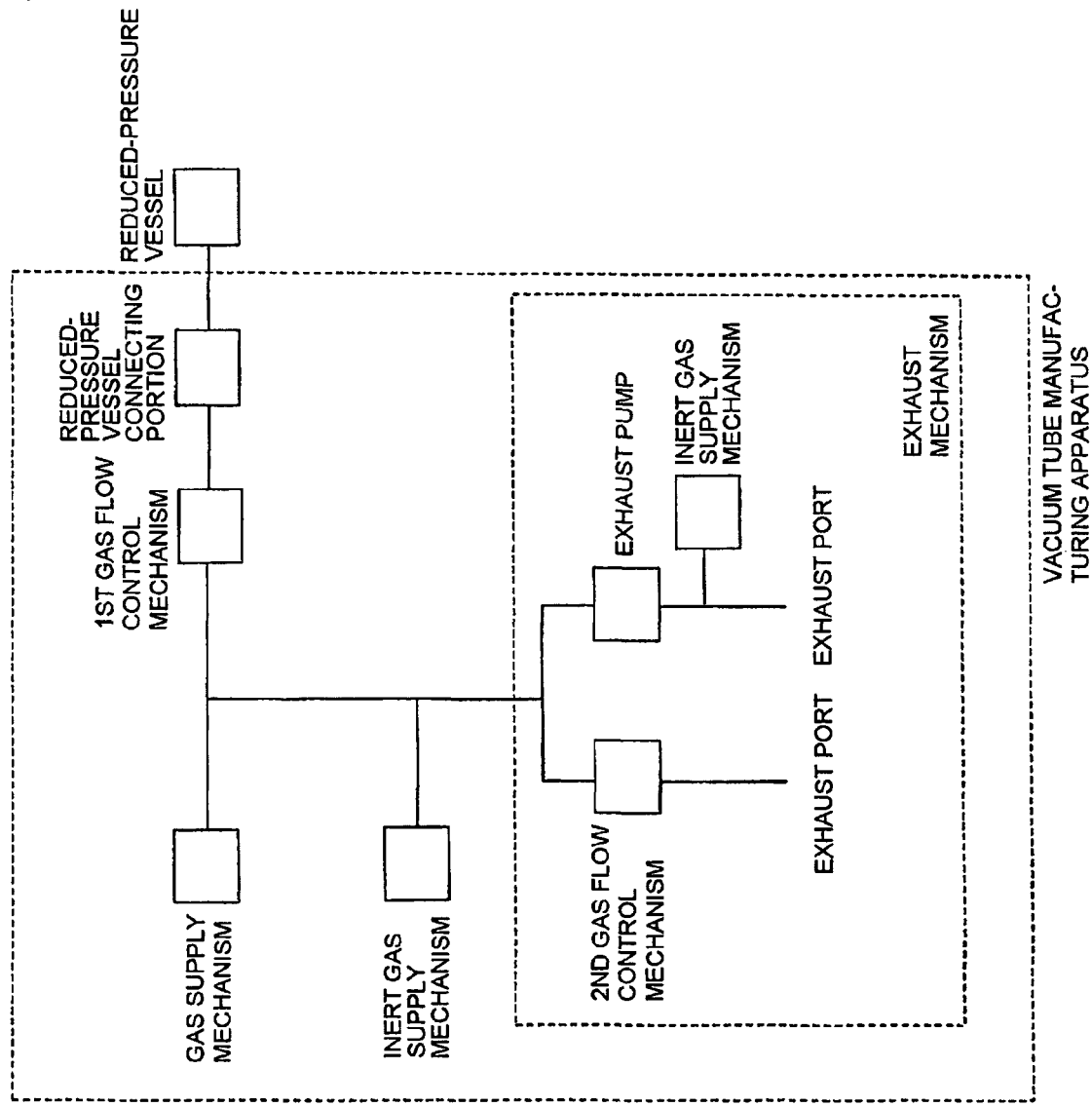
FIG. 5 is a block diagram showing a vacuum tube manufacturing apparatus having a first gas flow control mechanism.

As shown in FIG. 5, the vacuum tube manufacturing apparatus according to this invention is characterized by having a first gas flow control mechanism on the gas supply mechanism side of the reduced-pressure vessel connecting portion and a filling exhaust mechanism comprising a second gas flow control mechanism, and is further characterized in that the first gas flow control mechanism includes at least an orifice. Further, it is preferable that the second gas flow control mechanism includes at least an orifice and the diameter of the second orifice be larger than that of the first orifice. With this configuration, a small amount of high-purity gas can be filled into the reduced-pressure vessel while suppressing a mix of impurities into a pipe. Further, the gas supply mechanism preferably has at least a pressure control mechanism adapted to control the pressure inside the reduced-pressure vessel and the gas supply mechanism preferably has at least a flow rate control mechanism adapted to control the flow rate of gas flowing in the reduced-pressure vessel connecting portion. With this configuration, it is possible to fill the discharge gas with the purity/flow rate of a very small amount of the discharge gas being controlled.

Figure 6:
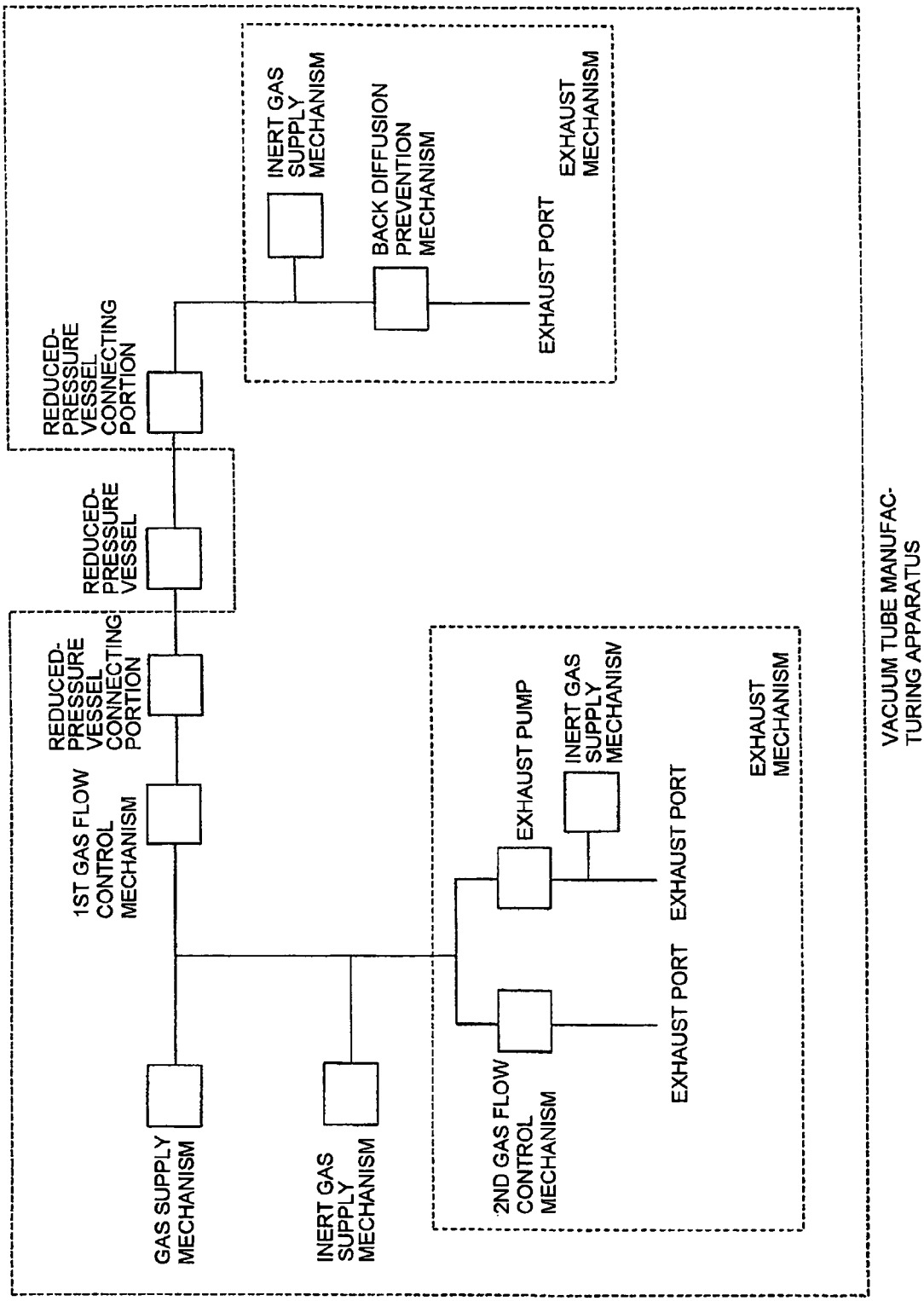
FIG. 6 is a block diagram showing another example of a vacuum tube manufacturing apparatus according to this invention.

Further, as shown in FIG. 6, the vacuum tube manufacturing apparatus according to this invention may have a second reduced-pressure vessel connecting portion different from the foregoing reduced-pressure vessel connecting portion, an inert gas supply mechanism connected to the second reduced-pressure vessel connecting portion, and a back diffusion prevention mechanism connected to the second reduced-pressure vessel connecting portion and is characterized in that the back diffusion prevention mechanism is a pipe or an orifice.

The flow rate of gas flowing in the pipe is preferably a flow rate that can suppress the invasion of moisture into the gas supply mechanism from the foregoing reduced-pressure vessel connecting portion and is preferably in the range of 1 SCCM to 1000 SCCM when the reduced-pressure vessel is not connected.

In order to suppress a mix of moisture into the vacuum tube vessel, it is preferable that the moisture concentration measured at the first reduced-pressure vessel connecting portion be 1 ppm or less. Further, in order to remove adsorbed moisture inside the pipe in a short time, it is preferable in the vacuum tube manufacturing apparatus of this invention that the surface adapted to contact the gas contains a metal oxide having chromium oxide or aluminum oxide as a main component.

The vacuum tube manufacturing apparatus configured as described above can be suitably used for a fluorescent tube, a cold cathode tube, a deuterium discharge tube, an electron beam tube, an X-ray generating tube, an ultraviolet generator, a static electricity neutralizer using a deuterium discharge tube, an X-ray generating tube, or an ultraviolet generating tube, or the like.

A vacuum tube manufacturing method according to this invention comprises a process of attaching a reduced-pressure vessel to a vacuum tube manufacturing apparatus, a process of exhausting a gas in the reduced-pressure vessel, a process of filling at least a discharge gas into the reduced-pressure vessel, and a process of separating the reduced-pressure vessel filled with the discharge gas from the vacuum tube manufacturing apparatus and is characterized in that a dry inert gas is caused to flow in a reduced-pressure vessel connecting portion of the vacuum tube manufacturing apparatus before the reduced-pressure vessel is attached thereto. Further, a vacuum tube manufacturing method according to this invention comprises a process of attaching a reduced-pressure vessel to a vacuum tube manufacturing apparatus, a process of exhausting a gas in the reduced-pressure vessel, a process of filling at least a discharge gas into the reduced-pressure vessel, and a process of separating the reduced-pressure vessel filled with the discharge gas from the vacuum tube manufacturing apparatus and is characterized in that the process of exhausting the gas in the reduced-pressure vessel performs combination of filling and exhaust of a dry gas a plurality of times and the process of exhausting the gas in the reduced-pressure vessel is carried out by raising the reduced-pressure vessel to a temperature higher than a room temperature. With this configuration, it is possible to efficiently remove moisture in the reduced-pressure vessel such as a glass tube or a quartz tube forming a vacuum tube.

Description will be made about the above with reference to the drawings.

Figure 7:
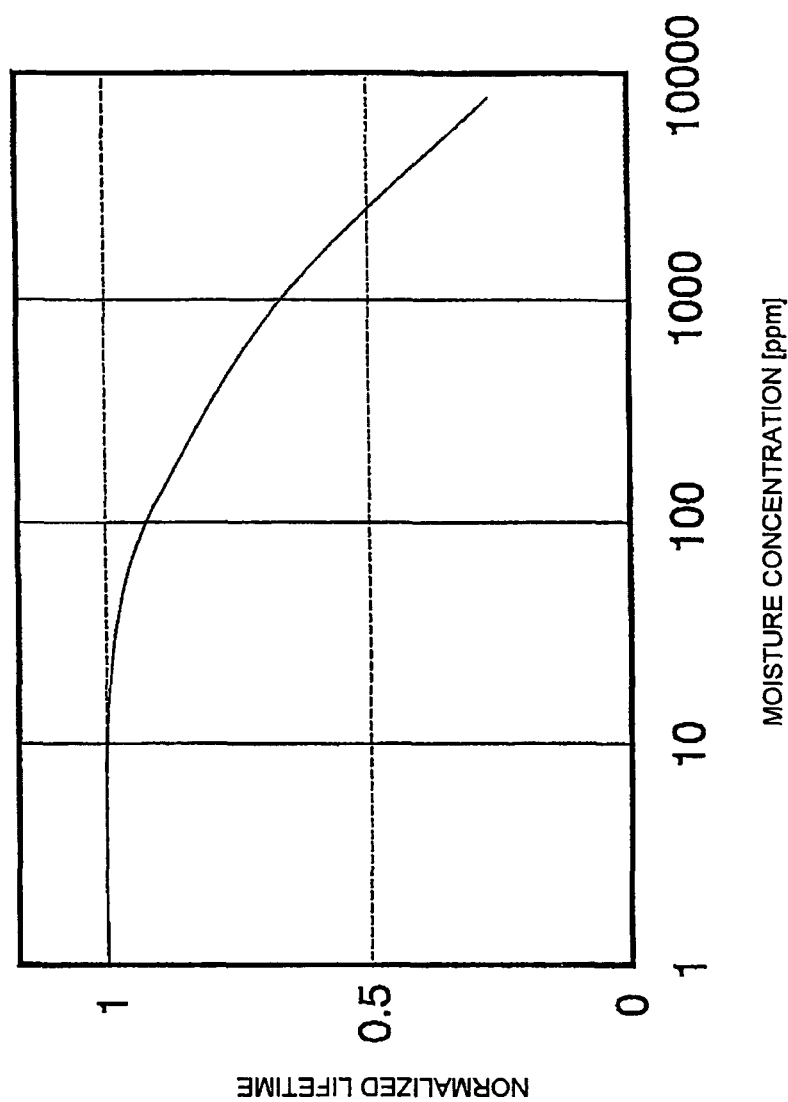
FIG. 7 is a graph showing the moisture concentration in a vacuum tube and the lifetime characteristics until an electrode is disconnected when a filament is energized.

FIG. 7 shows the lifetime characteristics until an electrode is disconnected or broken when an electric current is caused to flow through a tungsten filament sealed in a vacuum tube with the moisture concentration controlled in the vacuum tube, while the internal pressure in the tube is being kept at 10 Torr. The moisture concentration at atmospheric pressure in an argon gas sealed in the vacuum tube is plotted along the axis of abscissas in FIG. 7. It is understood that the characteristics are significantly degraded when the moisture concentration becomes 100 ppm or more as compared with the lifetime in the case of mixing no moisture. Further, it has been ascertained through experiments by the inventors that this phenomenon is similarly applied to a cold cathode tube and other vacuum tubes. Further, according to experiments by the inventors, it has been ascertained that moisture is adsorbed, depending on the moisture concentration in the reduced-pressure vessel, on the inner wall of a reduced-pressure vessel such as a glass tube, that forms a vacuum tube. Unless this moisture is removed on manufacturing the vacuum tube, the moisture stays inside the reduced-pressure vessel due to desorption, thereby degrading the electrode properties.

Figure 8:
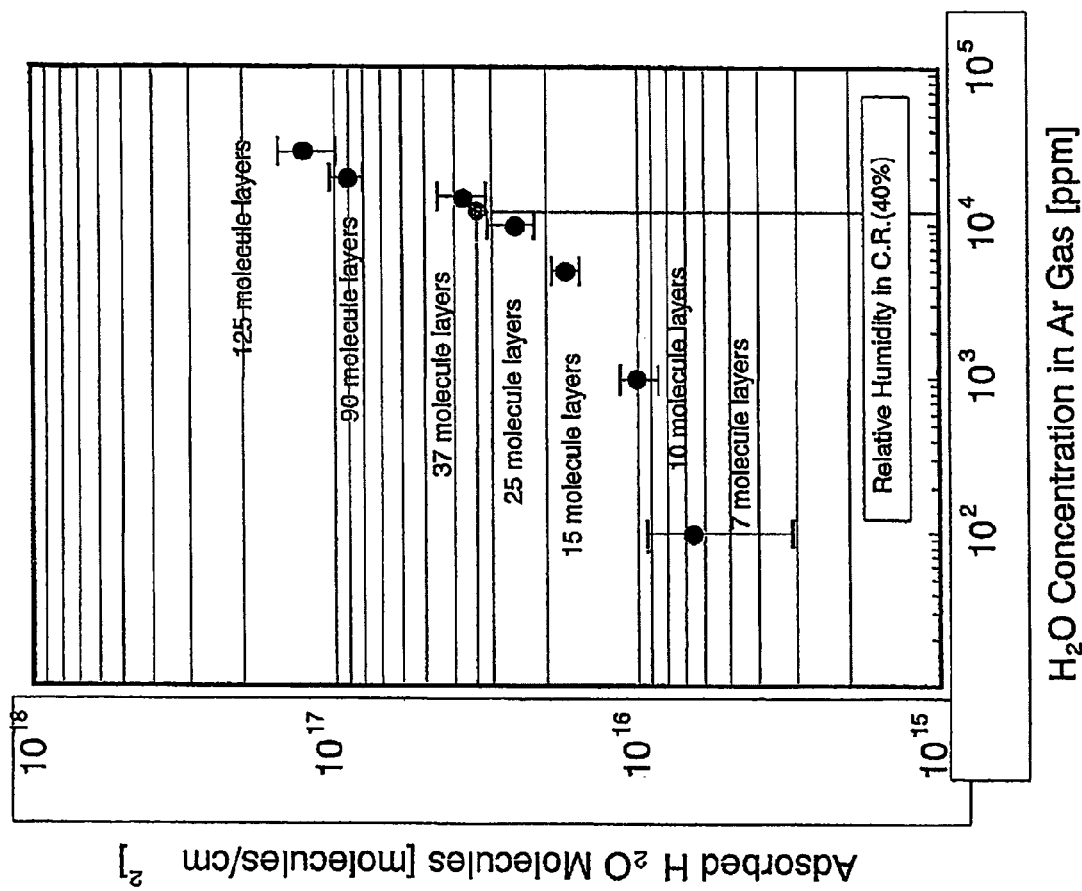
FIG. 8 is a graph showing the relationship between the moisture concentration contained in an argon gas atmosphere at atmospheric pressure and the moisture amount adsorbed on the inner wall of a vessel.

FIG. 8 shows the relationship between the moisture concentration contained in an argon gas atmosphere at atmospheric pressure and the moisture amount adsorbed on the inner wall of a vessel, wherein when the moisture concentration is 100 ppm or less, the adsorbed moisture amount becomes approximately $1 \times 10^{16}$ molecules/cm$^2$. Therefore, the moisture amount remaining in a gas filled in a vacuum tube is desirably as small as possible, preferably 100 ppm or less and more preferably 10 ppm or less. In addition, it has been found by experiments that unless the moisture amount adsorbed on the glass tube wall is set to $1 \times 10^{16}$ molecules/cm$^2$ or less in advance, the moisture concentration in the vacuum tube resultantly increases due to desorption, thereby reducing the electrode lifetime.

Example 1

A vacuum tube in Example 1 of this invention will be described with reference to FIGS. 9 to 25, by exemplifying a cold cathode tube. Herein, cold cathode tube manufacturing processes are shown which comprises a process of carrying out positive pressure baking by the use of a high-purity oxygen gas and a 100 Torr vacuum batch purge process to thereby completely remove water molecules and organic molecules remaining in a cold cathode tube, thereafter, a process of filling Ne and He into the cold cathode tube in a ratio of 9:1, and a process of setting a degree of the sealed vacuum to 60 Torr.

Figure 9:
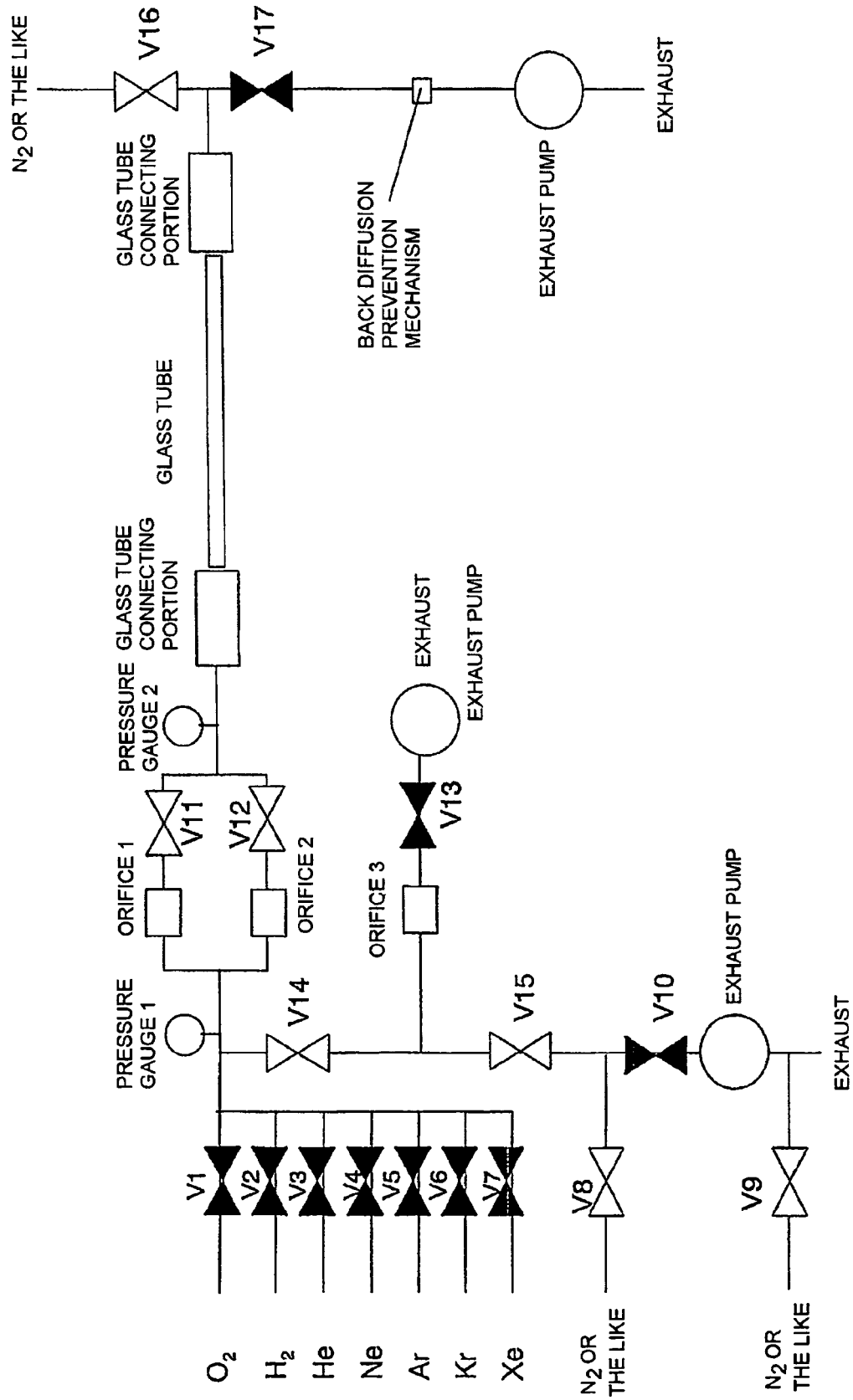
FIG. 9 is a diagram showing a vacuum tube manufacturing process in Example 1 of this invention, wherein there is shown the state at a time of attaching a glass tube.

FIG. 9 shows the state appearing on mounting a glass tube, wherein a valve indicated in black is in a closed state while a valve indicated in white is in an opened state. On mounting the glass tube in FIG. 9, the glass tube is connected in the state where, in order to prevent a mix of atmospheric components into a gas supply line in a vacuum tube manufacturing apparatus, V8, V15, V14, V11, V12, and counter-electrode-side V16 are set to the opened states to allow a predetermined amount of high-purity N$_2$ to be ejected according to diameters of an orifice 1 and an orifice 2. Herein, an orifice diameter 1 is set to ϕ0.1 mm, an orifice diameter 2 to (ϕ0.2 mm, and an orifice diameter 3 to ϕ0.3 mm. When the pressure is adjusted so that a pressure gauge 1 indicates 0.3 MPa, the flow rates that flow through the orifices become approximately 0.5 L/min, 1 L/min, and 2 L/min, respectively, in the case of N$_2$.

Figure 10:
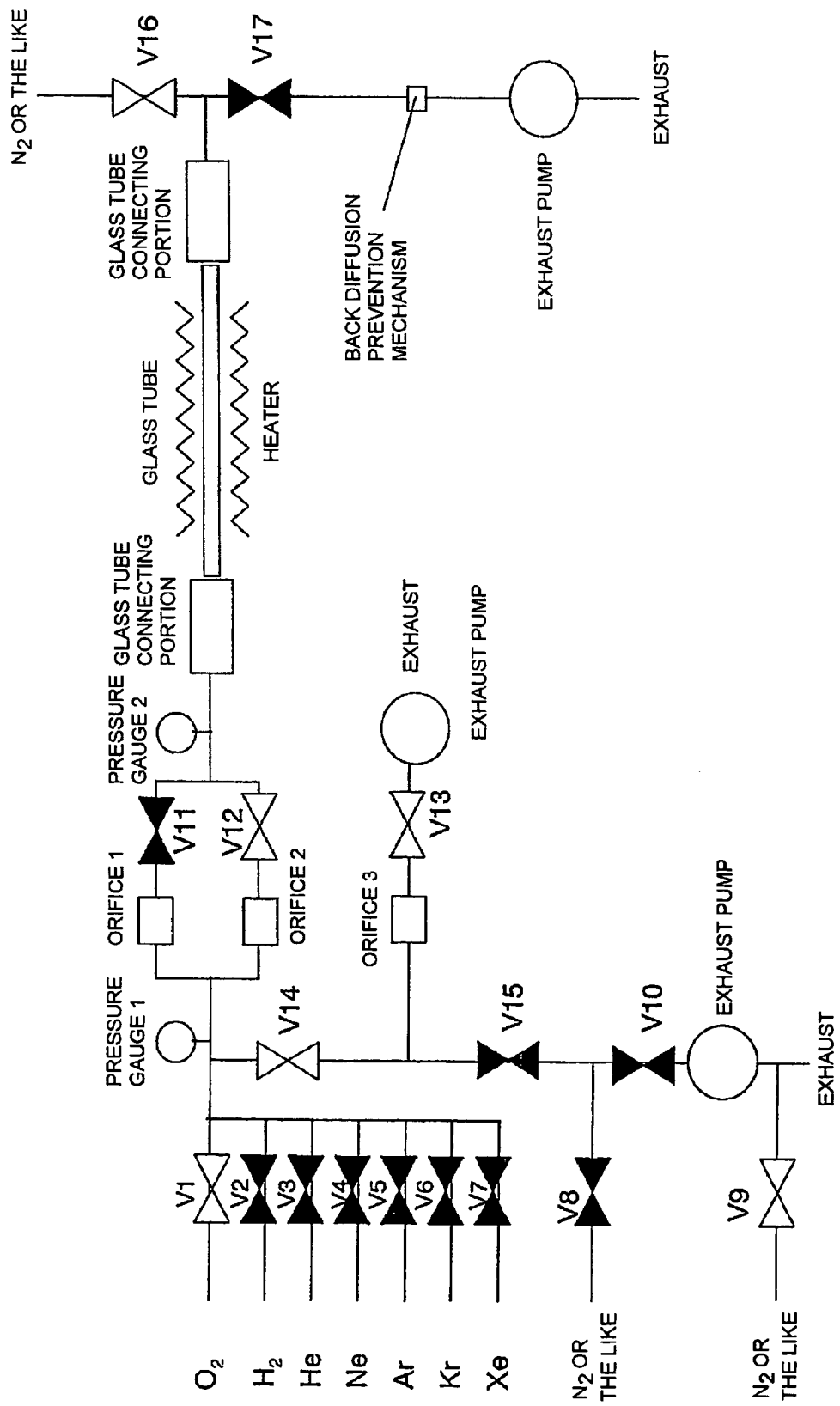
FIG. 10 is a diagram showing the state at a time of oxygen gas baking in the manufacturing process.

Then, at a time of oxygen gas baking in FIG. 10, V1, V12, and V16 are opened to remove moisture from the glass tube and further to burn organic matter with high-purity oxygen to convert it into low molecular organic matter having a high vapor pressure, thereby efficiently removing it. Further, when also purging an oxygen line, V14 and V13 may be opened to achieve a sufficient purge flow rate. The baking temperature is set to 400° C. which is an upper limit temperature at which no oxidation degradation of a phosphor occurs due to oxygen gas. On the other hand, when final baking is carried out with Ar, the temperature may be raised to 600° C. at which the glass tube is not degraded.

Figure 11:
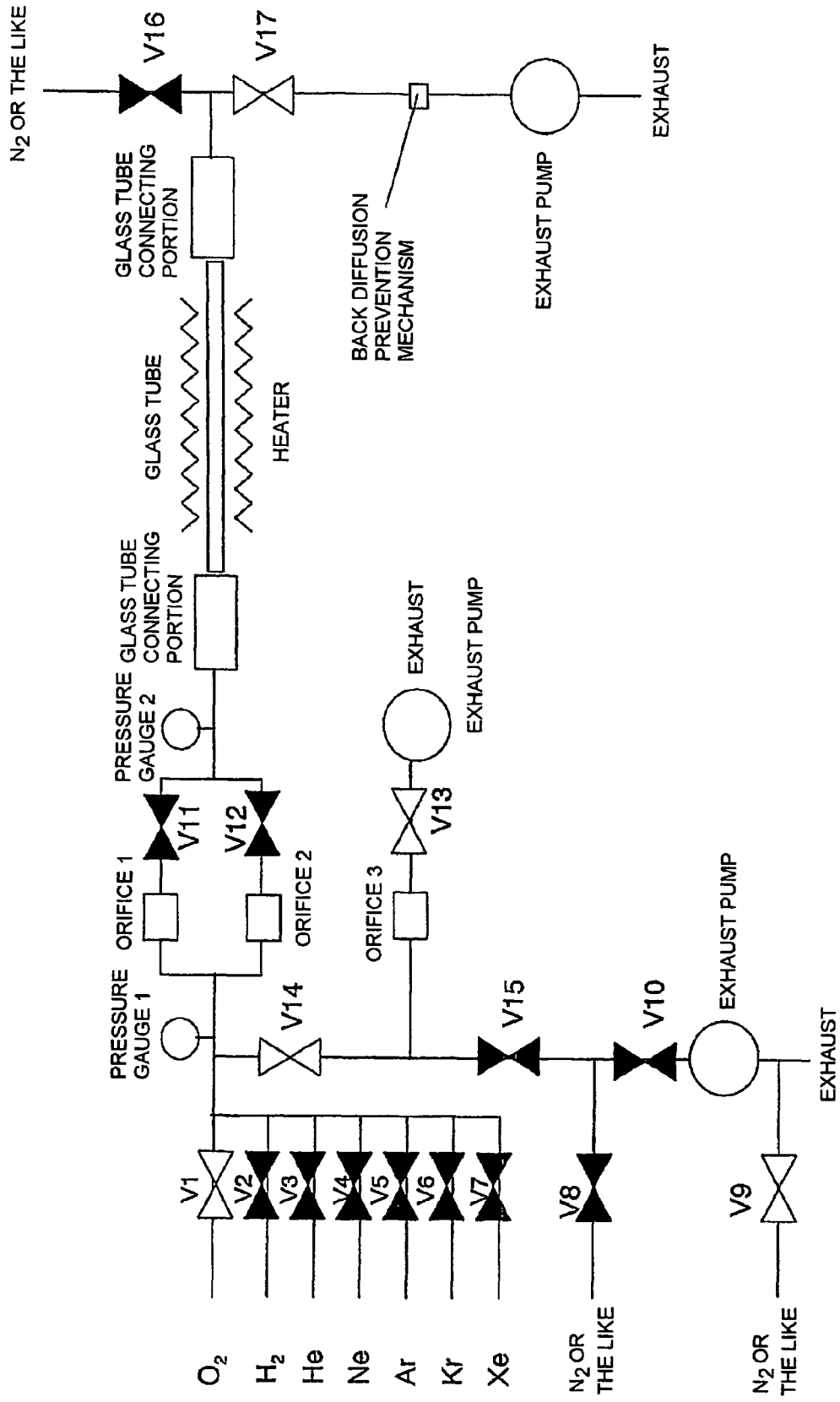
FIG. 11 is a diagram showing the state at a time of vacuum batch $O_2$ baking in the manufacturing process.
Figure 12:
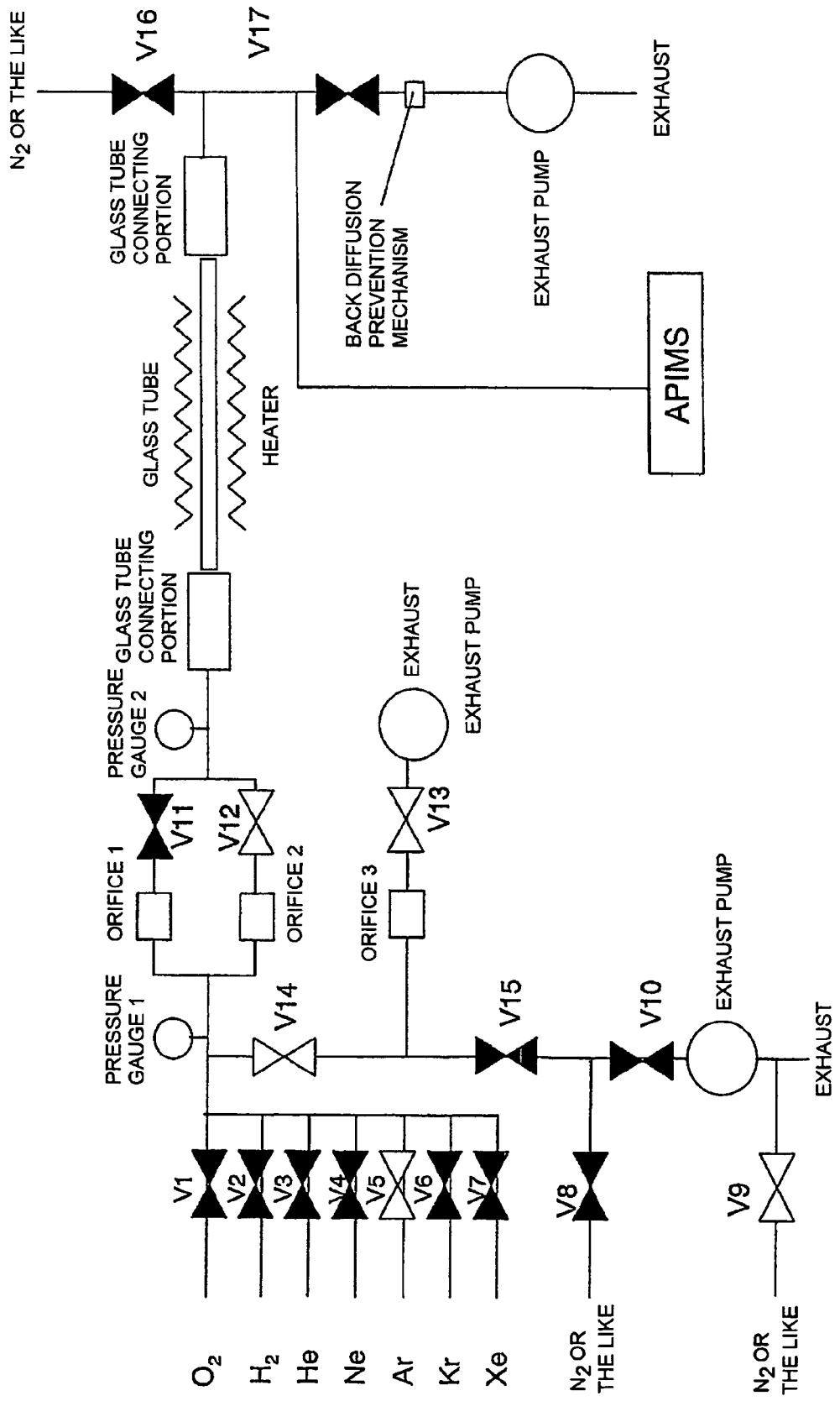
FIG. 12 is a diagram showing the state where an Ar gas having passed through the glass tube is analyzed by the use of an atmospheric pressure ionization mass spectrometer (APIMS) connected to the downstream of the glass tube.

At a time of vacuum batching in FIG. 11, V12 and V16 are closed and V17 is opened from the state of FIG. 10, and oxygen is exhausted until a pressure gauge 2 indicates 100 Torr. This is a process for expelling moisture and organic matter remaining in gaps among phosphor particle groups. After repeating the processes of FIGS. 10 and 11 ten times or more, V1 was closed and V5 was opened to thereby switch to Ar and the Ar gas having passed through the glass tube was analyzed by the use of an atmospheric pressure ionization mass spectrometer (APIMS) connected to the downstream of the glass tube (FIG. 12). Then, it was confirmed that the concentration of moisture and organic matter was 1 ppb or less. The moisture and organic matter remaining in the tube can be more sufficiently expelled as the repetition number of times of the processes of FIGS. 10 and 11 increases, but it is preferably as small as possible in terms of productivity. According to a study by the inventors, although the repetition number depends on the shape and size of a glass tube, a repetition time may be about 2 to 20 times and more preferably be 5 to 10 times.

Figure 13:
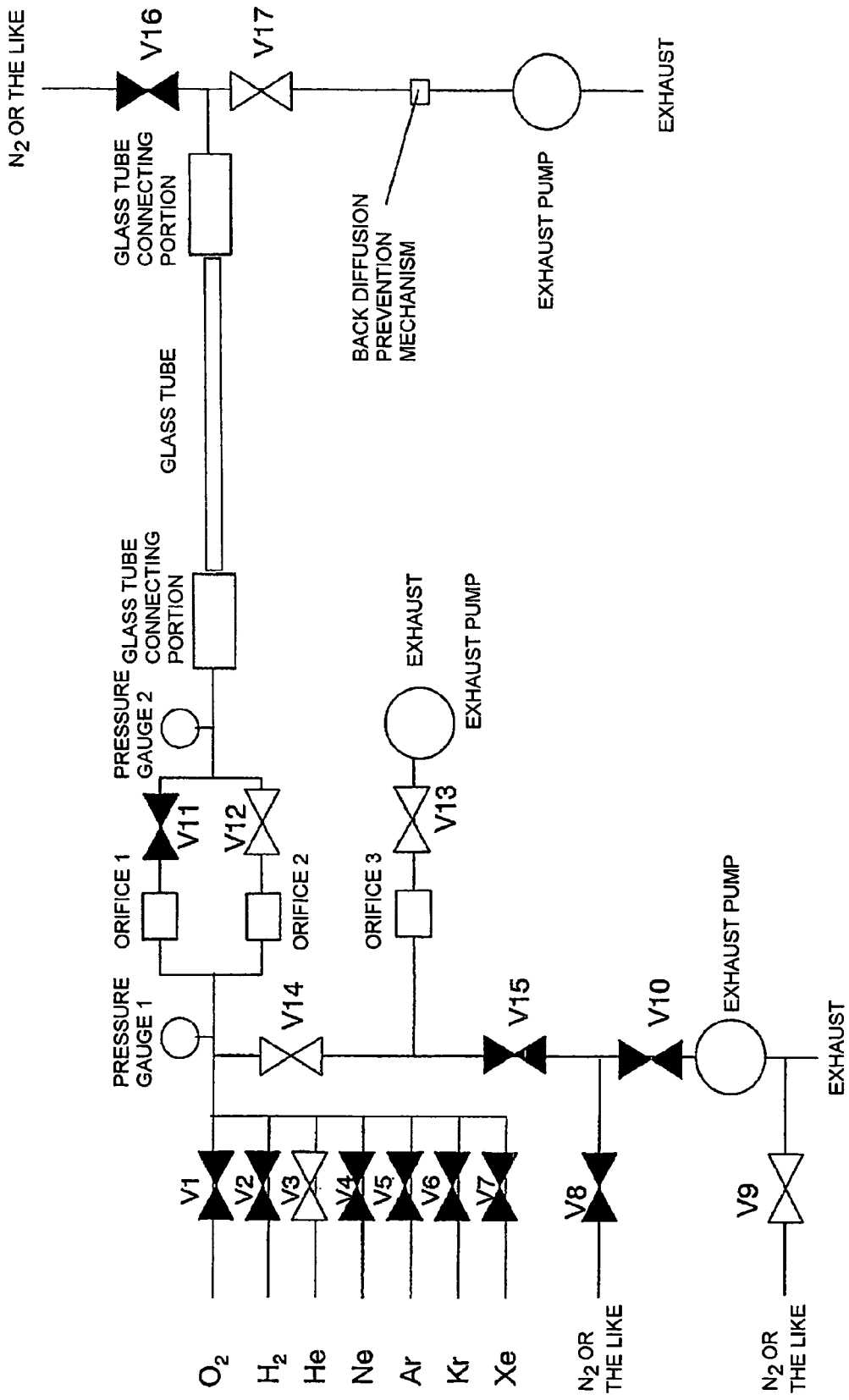
FIG. 13 is a diagram showing the state when the supply of Ar is switched to that of He.
Figure 14:
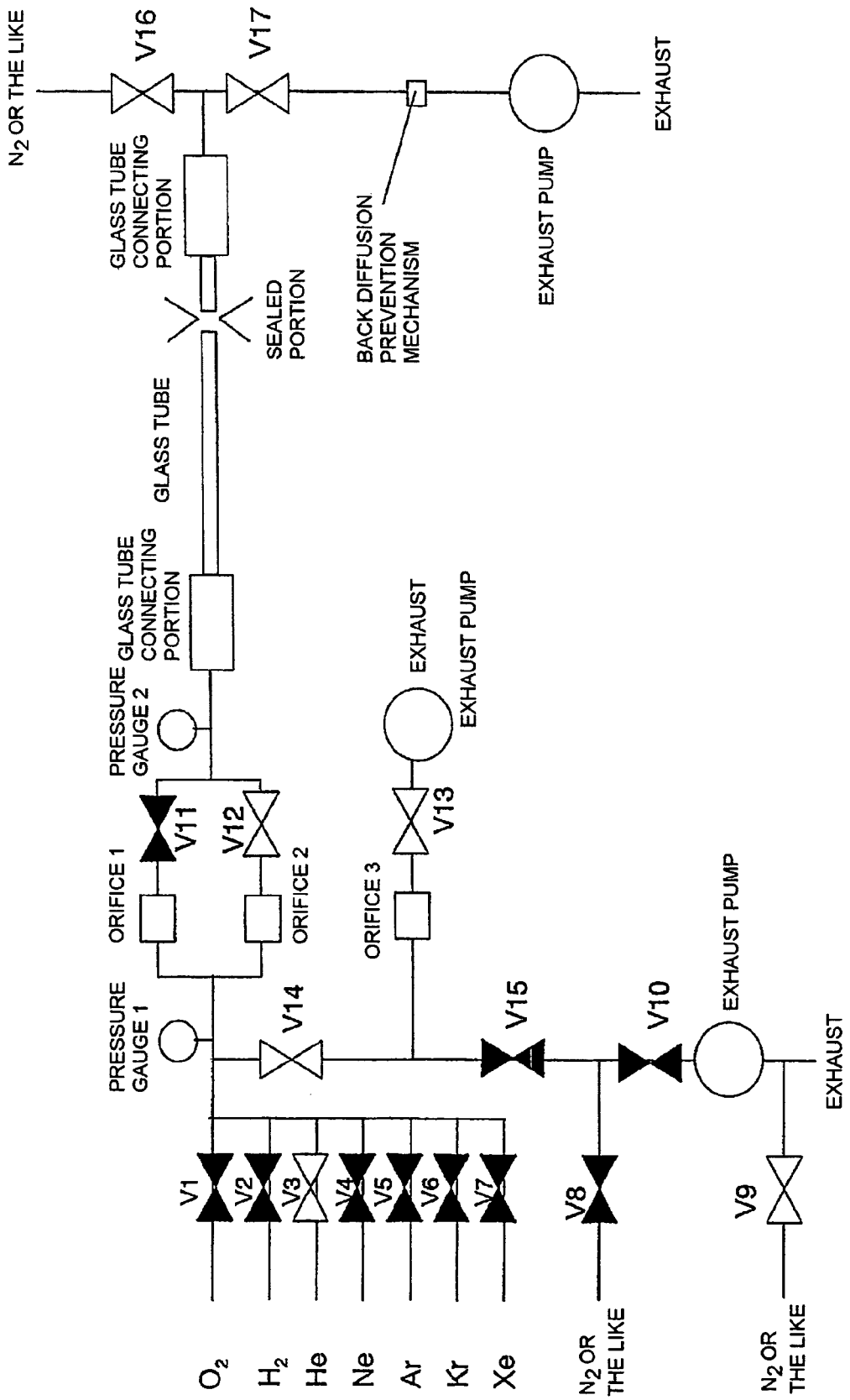
FIG. 14 is a diagram showing the state where the glass tube is sealed and cut on its counter electrode side.

In a process of FIG. 13, V5 is closed and V3 is opened for switching from the supply of Ar to that of He, thereby substituting He in the glass tube, and then the glass tube is completely sealed on its counter electrode side in a process of FIG. 14. Thereafter, filling/exhaust of He is repeated for removing gas components generated from a sealing portion of the glass tube during the sealing.

Figure 15:
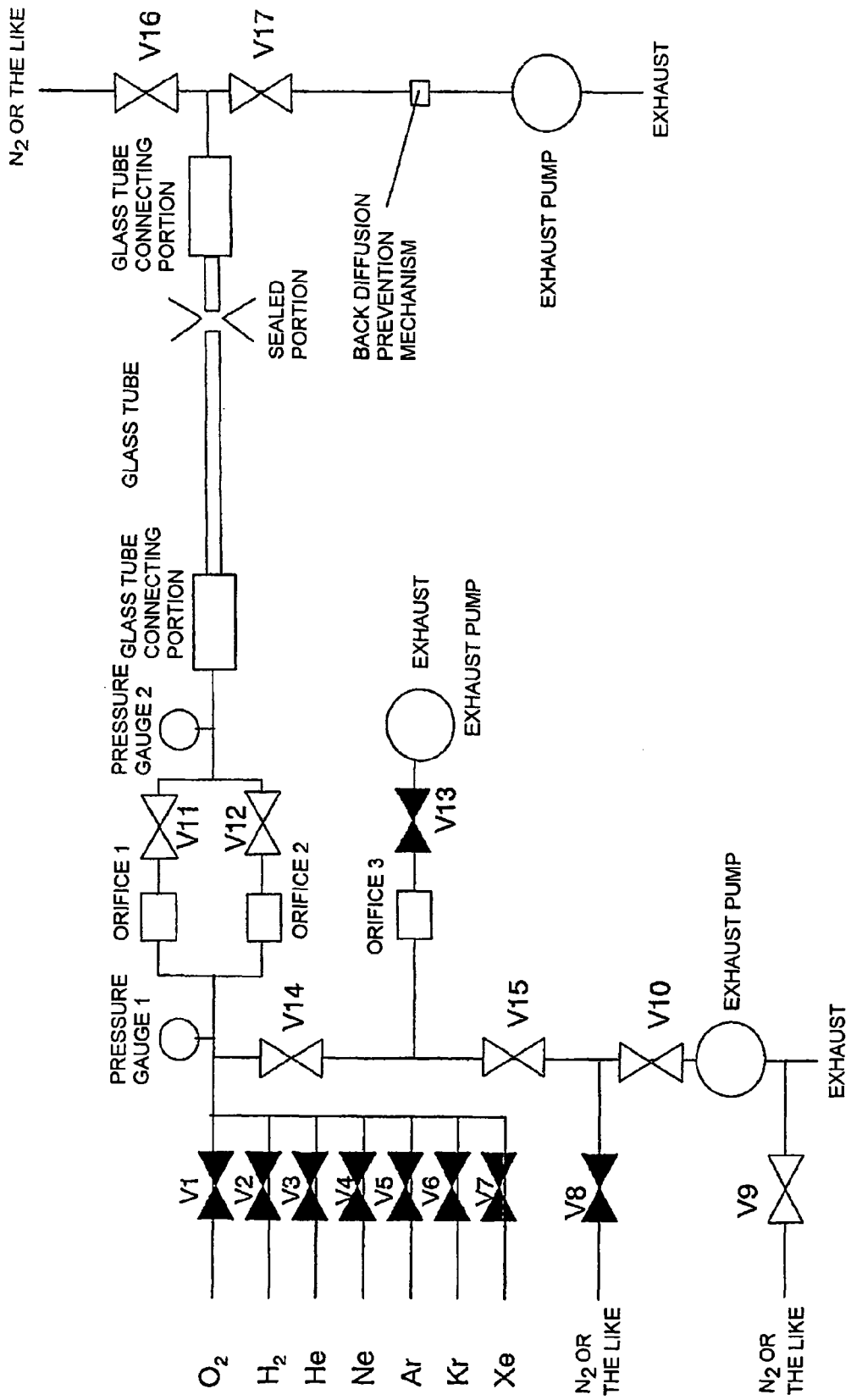
FIG. 15 is a diagram showing the state in a He exhaust process.
Figure 16:
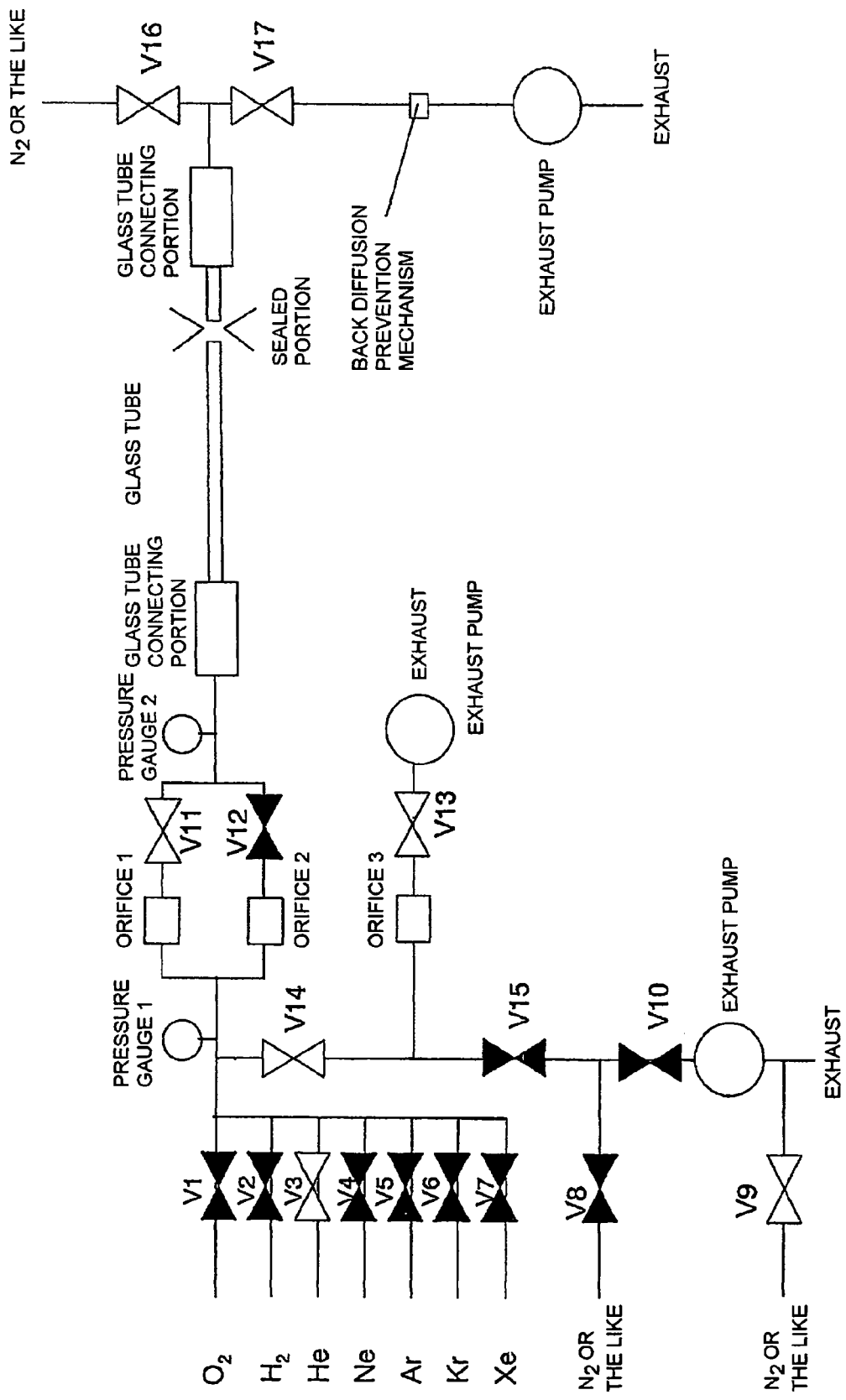
FIG. 16 is a diagram showing the state in a He filling process.
Figure 17:
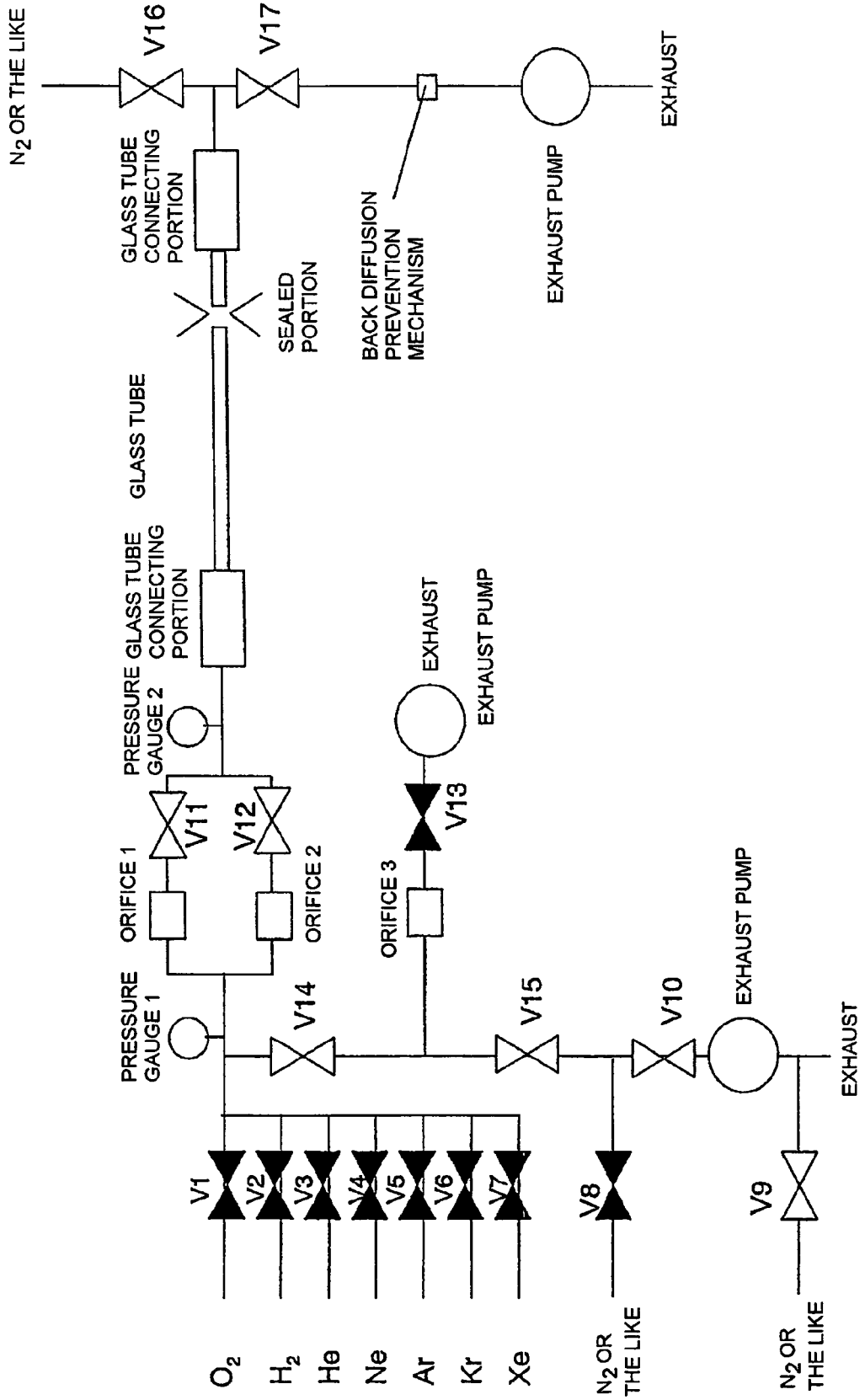
FIG. 17 is a diagram showing a process after the state shown in FIG. 16.
Figure 18:
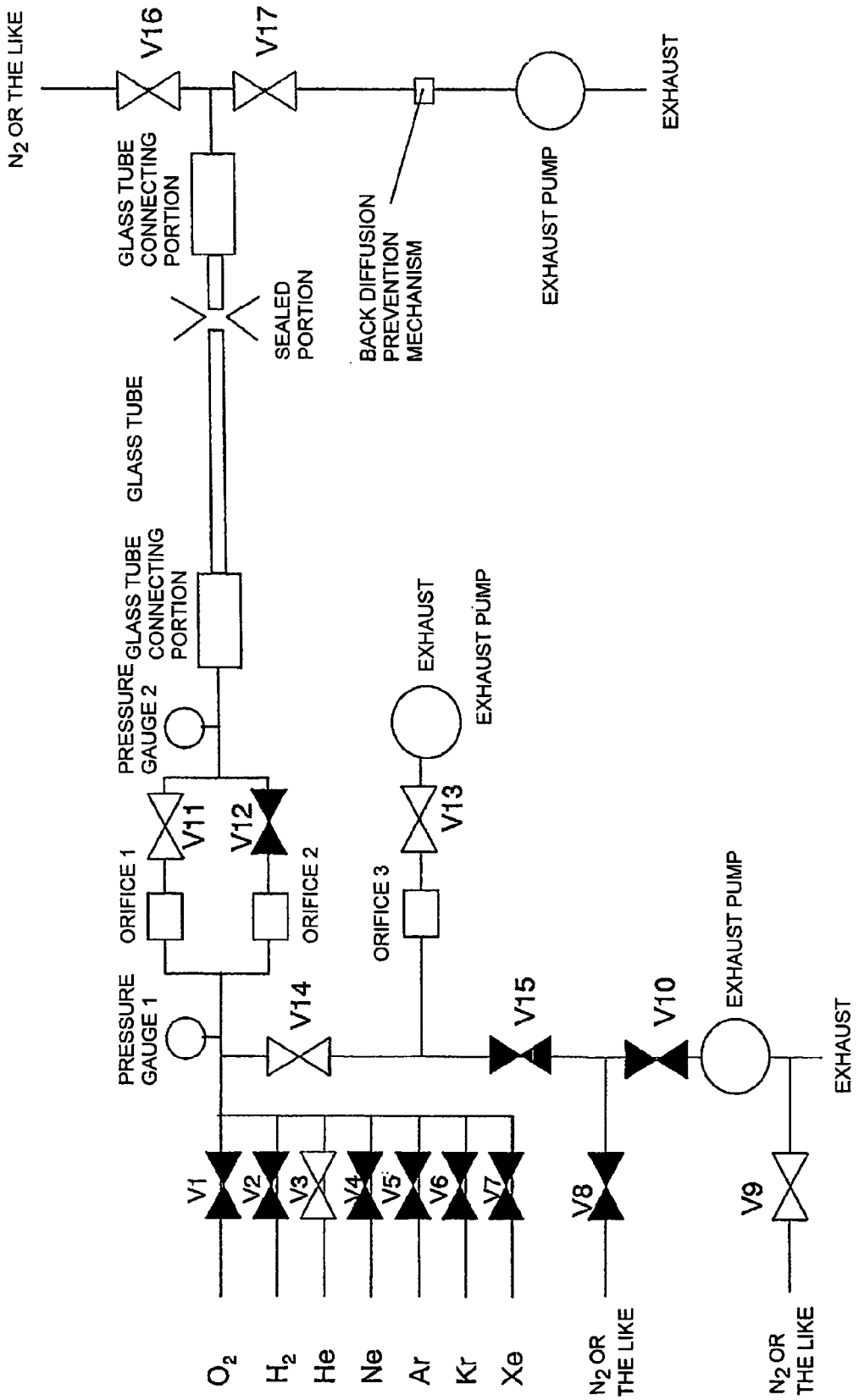
FIG. 18 is a diagram showing a process of filling He until the value of a pressure gauge 2 becomes 54 Torr at a final stage.
Figure 19:
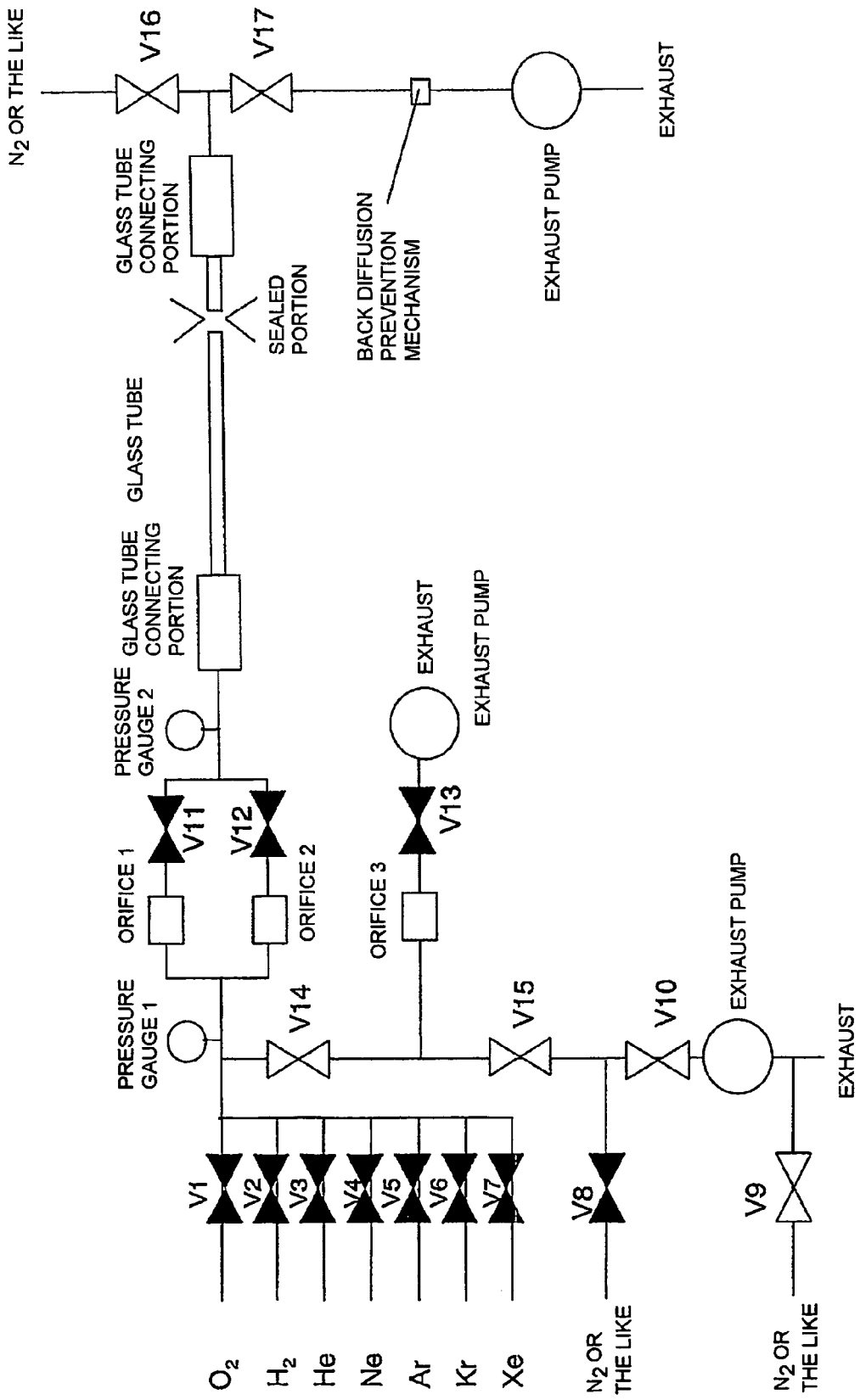
FIG. 19 is a diagram showing a He exhaust process after filling He in FIG. 18.

After repeating the processes of FIGS. 15 and 16 five times or more and completely substituting He in the glass tube, He is exhausted as shown in FIG. 17 and then He is filled until the value of the pressure gauge 2 becomes 54 Torr at a final stage of a process of FIG. 18. V11 is closed at a time instant when 54 Torr is indicated (FIG. 19).

Figure 20:
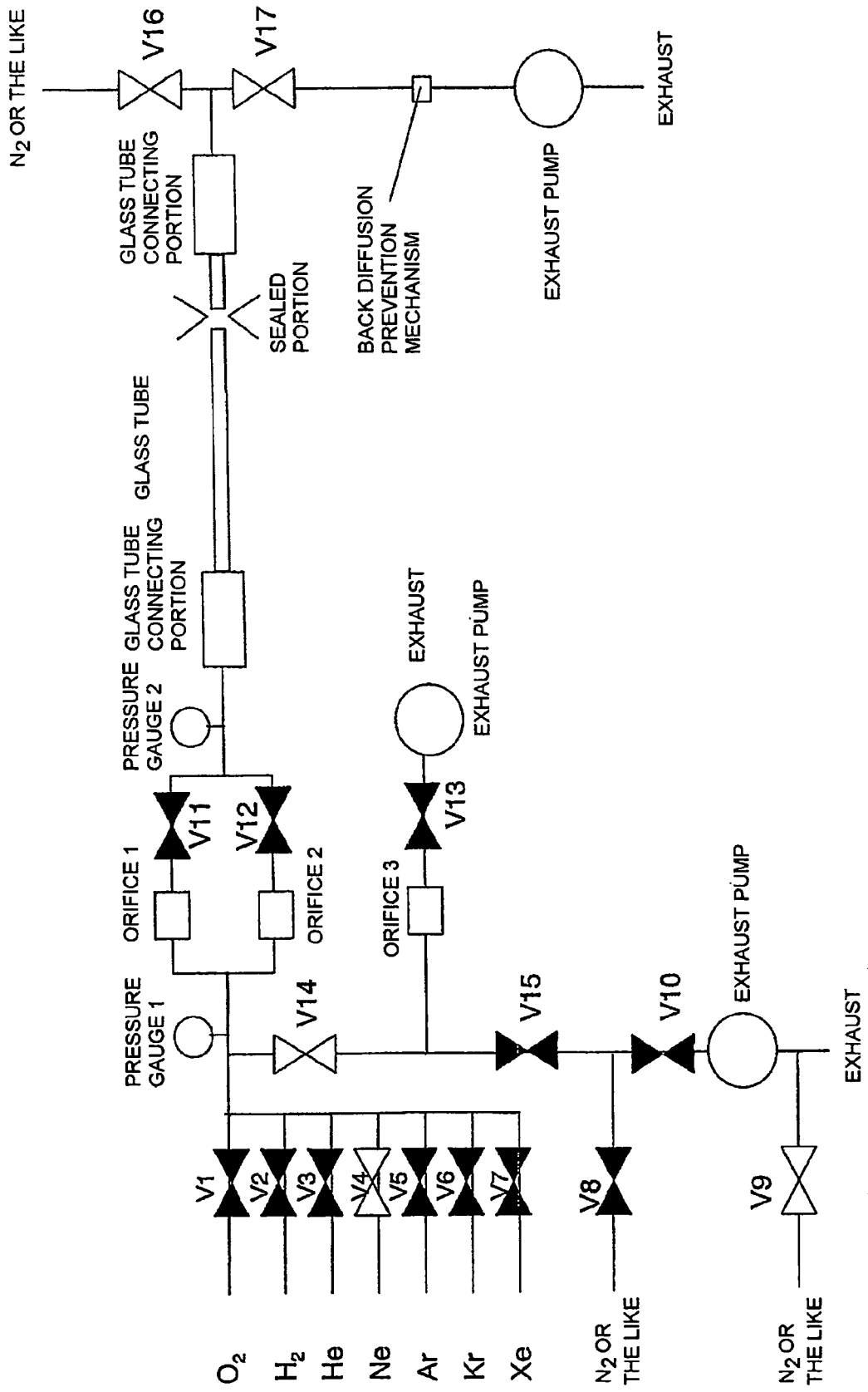
FIG. 20 is a diagram showing a Ne filling process for completely substituting Ne for remaining He.
Figure 21:
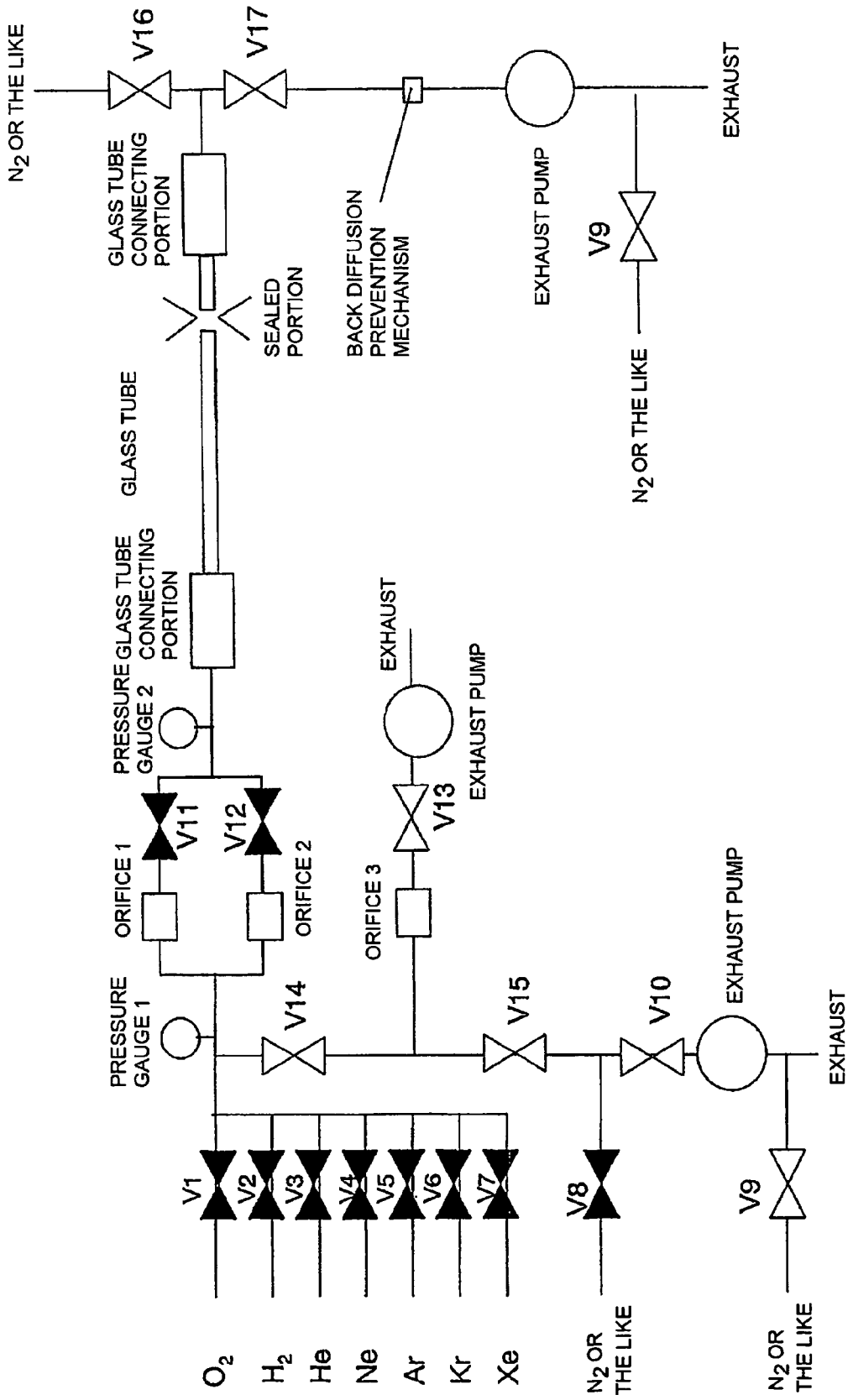
FIG. 21 is a diagram showing a Ne exhaust process after the filling of Ne.
Figure 22:
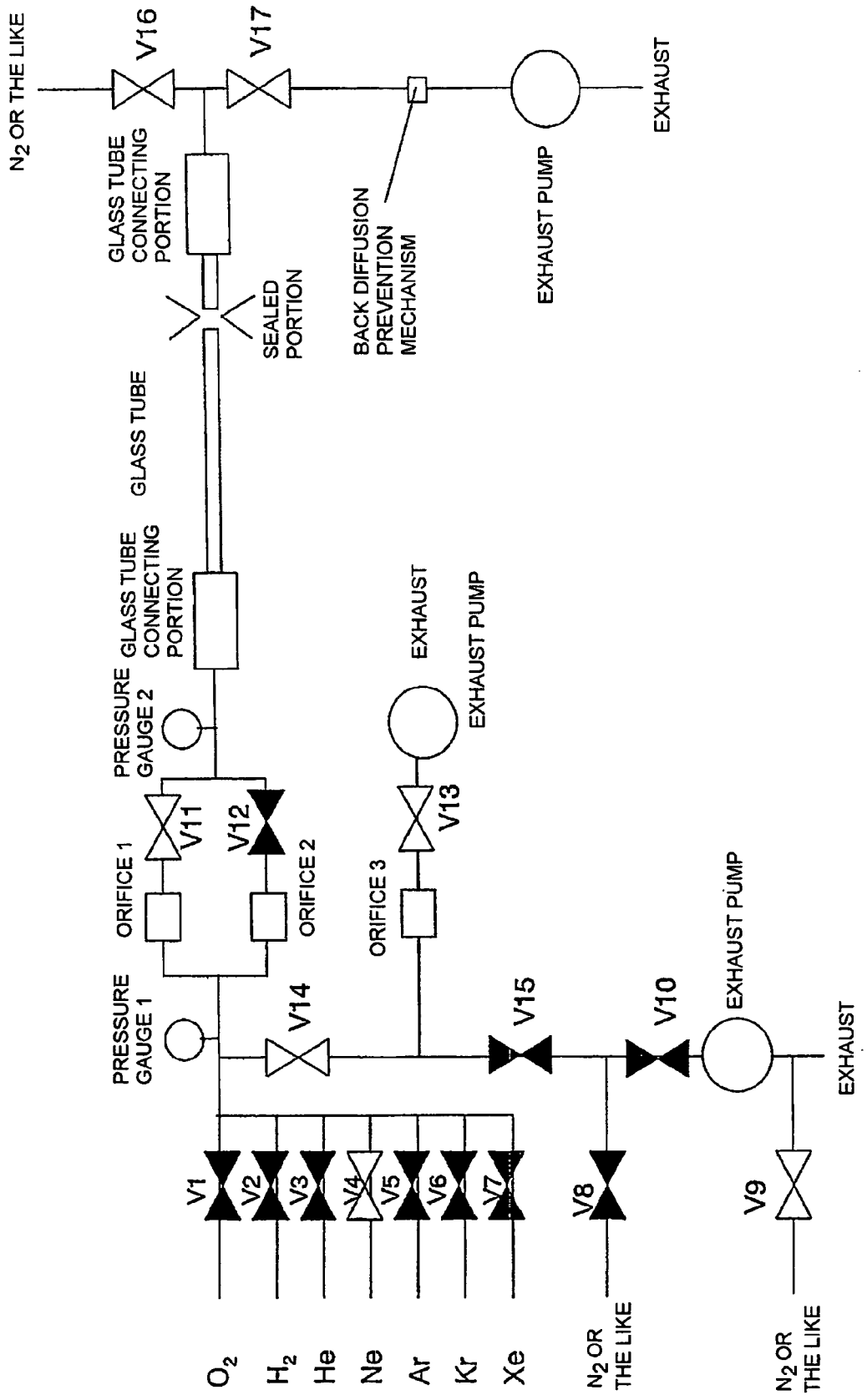
FIG. 22 is a diagram showing a process of filling Ne up to a predetermined pressure.
Figure 23:
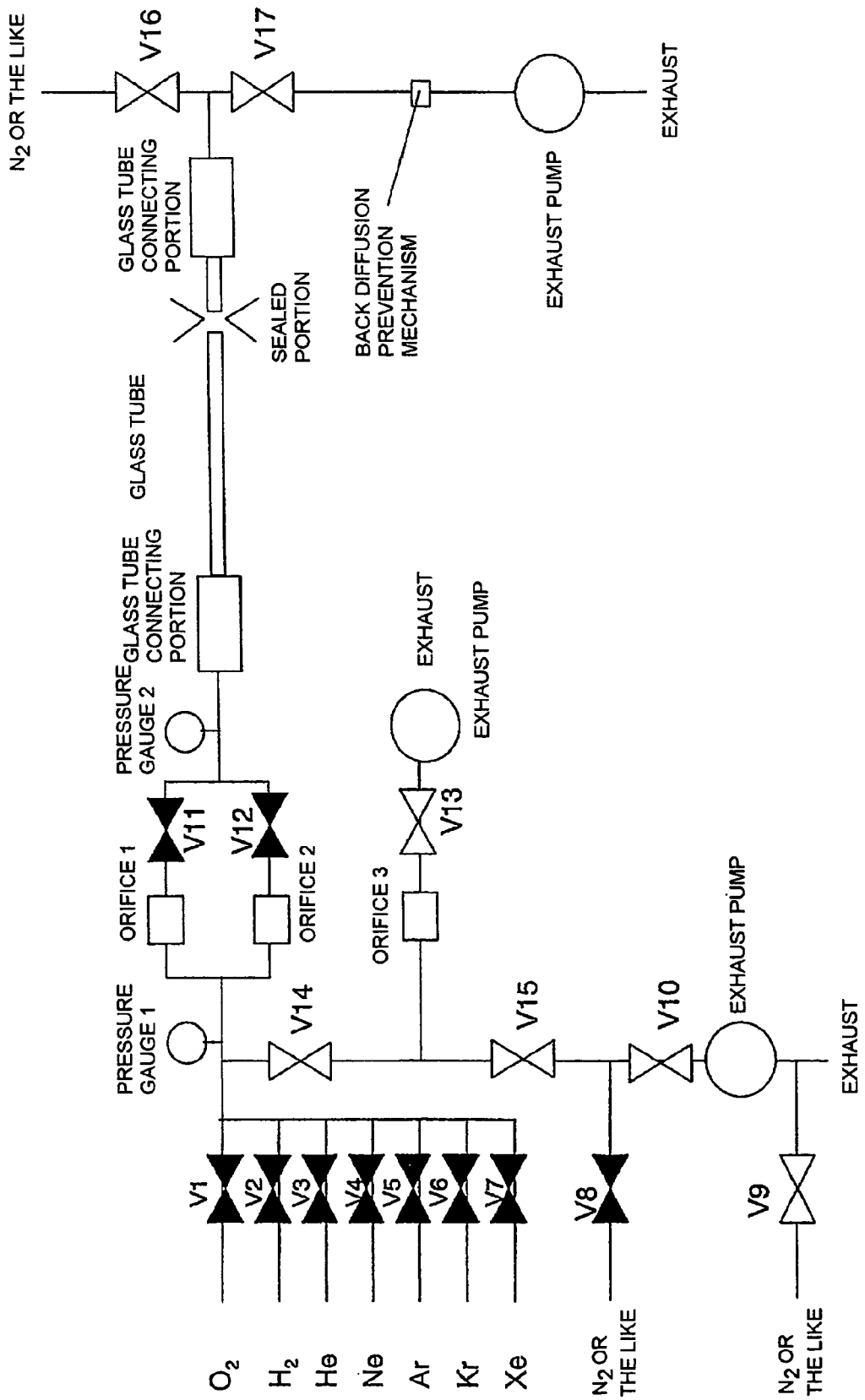
Figure 24:
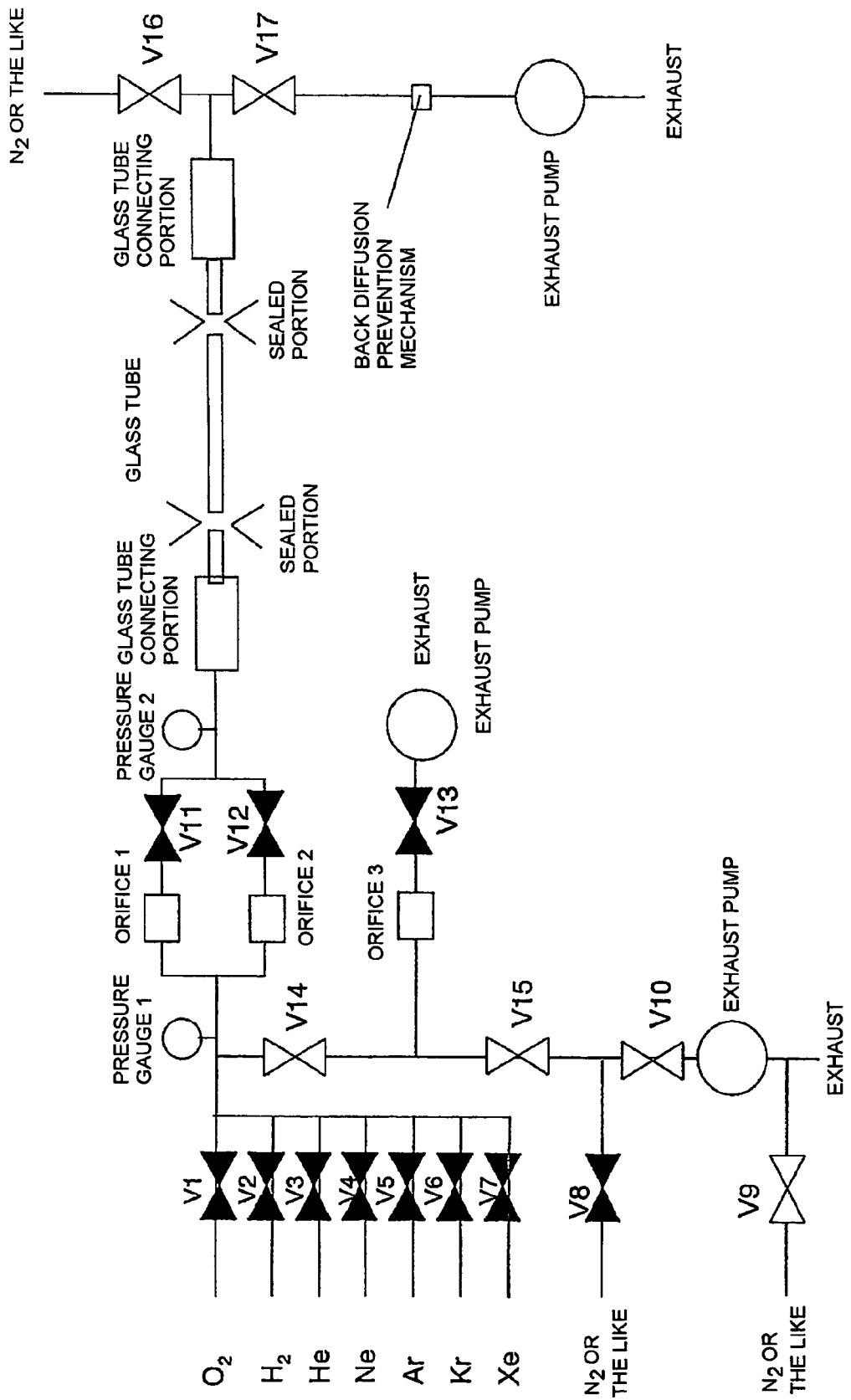
FIG. 24 is a diagram showing the state where the glass tube is sealed.
Figure 25:
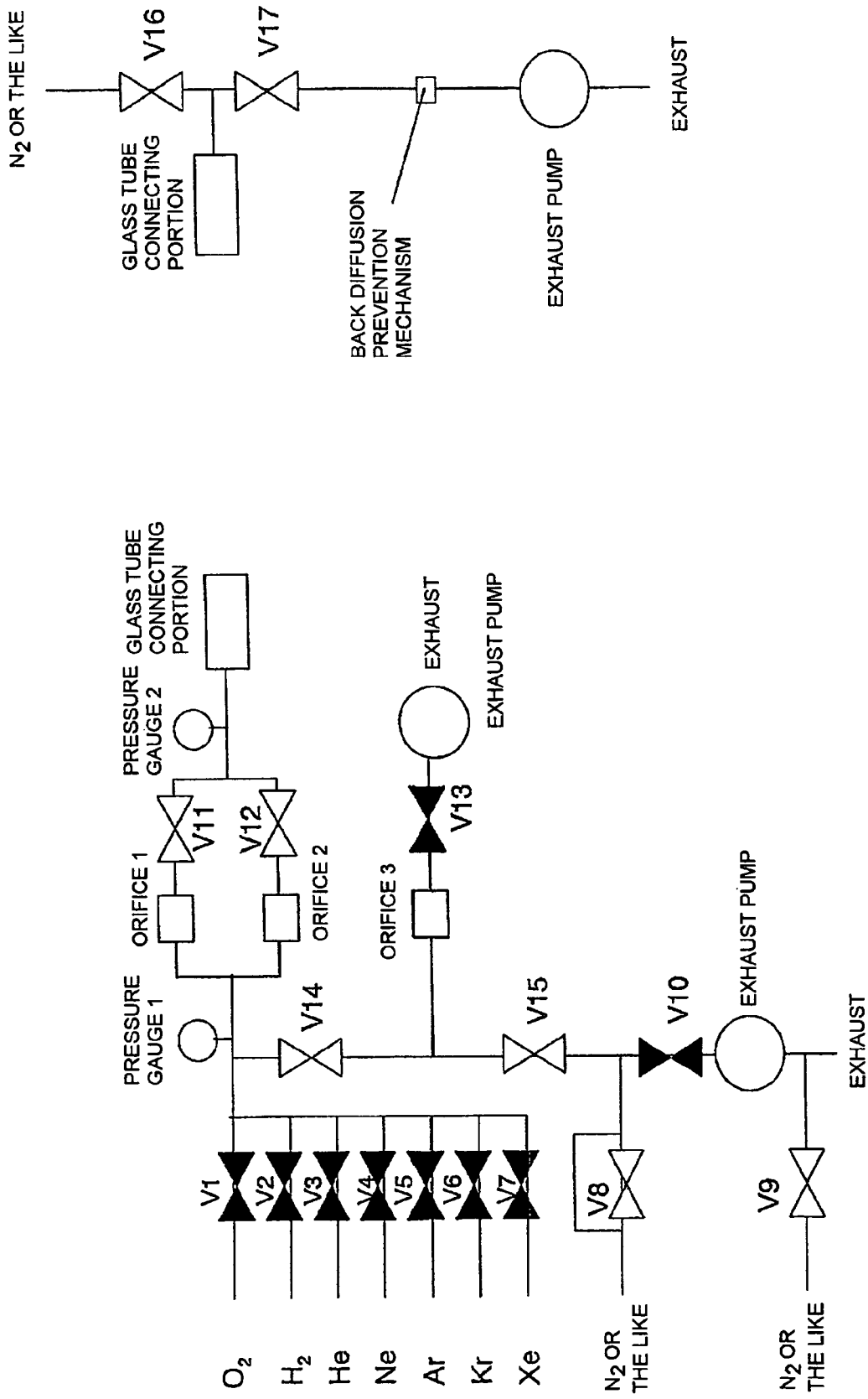
FIG. 25 is a diagram showing the state where the glass tube is detached.

In processes of FIGS. 20 and 21, Ne filling and Ne exhausting processes are repeated five times or more for completely substituting Ne for He remaining in the gas supply system. After completely substituting Ne, V11 is opened to fill Ne until the pressure gauge 2 indicates 60 Torr from 54 Torr (FIG. 22). V11 is closed at a time instant when 60 Torr is indicated. At this time instant, the glass tube is in the state where a gas with a ratio of He:Ne=9:1 is sealed in at 60 Torr (FIG. 23). Finally, the glass tube is completely sealed in a process of FIG. 24 and the glass tube is detached (FIG. 25). When detaching the glass tube, the glass tube is detached in the state where no atmospheric components leak into the gas supply line in the vacuum tube manufacturing apparatus. To this end, V8, V15, V14, V11, V12, and counter-electrode-side V16 are set to the opened states to allow a predetermined amount of high-purity $N_2$ to be ejected according to the diameters of the orifice 1 and the orifice 2.

The luminance half-decay lifetime of the cold cathode tube manufactured by this system was measured and had a lifetime which was 1.6 times as compared with a conventional tube manufactured by a conventional fluorescent tube manufacturing apparatus.

Example 2

Figure 26:
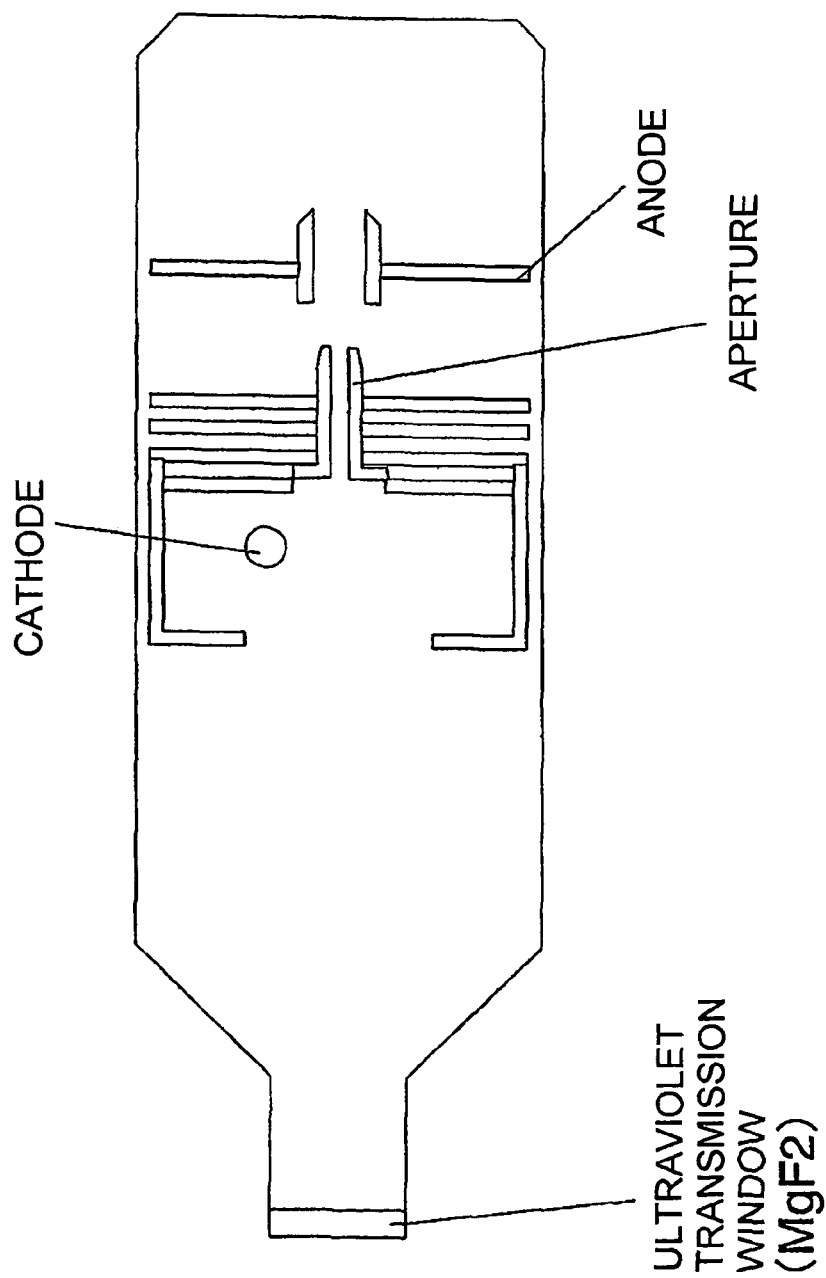
FIG. 26 is an exemplary diagram showing the structure of a deuterium discharge tube manufactured by this invention.

Description will be made about Example 2 in which this invention is applied to a deuterium discharge tube. FIG. 26 is an exemplary diagram showing the structure of a deuterium discharge tube manufactured by this invention. As shown in FIG. 26, the deuterium discharge tube comprises a glass tube being a reduced-pressure vessel, a tungsten cathode and an anode disposed in the glass tube, an aperture provided between the cathode and the anode, and an ultraviolet transmission window provided at an ultraviolet extracting portion of the glass tube. The ultraviolet transmission window is made of $MgF_2$. According to the same method as that described in Example 1, deuterium is filled while being controlled at a pressure of 5 Torr. The impurity concentrations of moisture/organic matter remaining in the deuterium discharge tube manufactured by a vacuum tube manufacturing apparatus of this invention and in a deuterium discharge tube manufactured by a conventional vacuum tube manufacturing apparatus were measured by the use of an APIMS and it was confirmed that the former was 1 ppb or less and the latter was 200 ppm. The luminance half-decay lifetimes were respectively measured and, as a result, it was confirmed that the former was 600 hours and the latter was 300 hours.

According to the vacuum tube manufacturing apparatus of this invention, it is possible to obtain the deuterium discharge tube with less degradation of lifetime because the impurity amount remaining in the tube can be suppressed.

The invention claimed is:

1. A vacuum tube having a reduced-pressure vessel comprising:
   at least a discharge gas sealed for electric discharge,
   wherein:
      the sum total of the number of organic gas molecules, the number of water molecules, and the number of oxygen molecules all of which remain inside a space of said reduced-pressure vessel is smaller than the number of molecules of said discharge gas,
      the number of water molecules which is adsorbed on an inner wall of said reduced-pressure vessel is not greater than $1 \times 10^{16}$ molecules/cm$^2$,
      a ratio of said number of molecules of said discharge gas to the sum total of said number of organic gas molecules and said number of water molecules is not smaller than ten times, and
      the reduced-pressure vessel is a component of a device selected from the group consisting of: a vacuum tube, a fluorescent tube, a cold cathode tube, a deuterium discharge tube, an electron beam tube, an X-ray generating tube, an ultraviolet generator, and a static electricity neutralizer.

2. A vacuum tube according to claim 1, wherein a gas/gases selected from the group consisting of He, Ne, Ar, Kr, Xe, $H_2$, and $D_2$ is/are used alone or mixed together as said discharge gas.

3. A vacuum tube according to claim 1, wherein said reduced-pressure vessel is made of silicon oxide as a main component.

\* \* \* \* \*

UNITED STATES PATENT AND TRADEMARK OFFICE
CERTIFICATE OF CORRECTION

PATENT NO.       : 8,502,450 B2                                                    Page 1 of 1
APPLICATION NO. : 10/594896
DATED            : August 6, 2013
INVENTOR(S)      : Ohmi et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1192 days.

Signed and Sealed this
Fifteenth Day of September, 2015

Michelle K. Lee
*Director of the United States Patent and Trademark Office*